(12) United States Patent
Finkbeiner et al.

(10) Patent No.: US 10,068,652 B2
(45) Date of Patent: Sep. 4, 2018

(54) APPARATUSES AND METHODS FOR DETERMINING POPULATION COUNT

(71) Applicant: Micron Technology, Inc., Boise, ID (US)

(72) Inventors: Timothy P. Finkbeiner, Boise, ID (US); Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 14/833,796

(22) Filed: Aug. 24, 2015

(65) Prior Publication Data

US 2016/0062692 A1    Mar. 3, 2016

Related U.S. Application Data

(60) Provisional application No. 62/045,257, filed on Sep. 3, 2014.

(51) Int. Cl.
*G11C 16/26*    (2006.01)

(52) U.S. Cl.
CPC .................... *G11C 16/26* (2013.01)

(58) Field of Classification Search
CPC .................................................. G06F 15/7821
USPC ......................................................... 708/210
See application file for complete search history.

(56) References Cited

U.S. PATENT DOCUMENTS 4,380,046 A    4/1983    Fung
4,435,792 A    3/1984    Bechtolsheim
4,435,793 A    3/1984    Ochii
4,727,474 A    2/1988    Batcher
4,843,264 A    6/1989    Galbraith
(Continued)

FOREIGN PATENT DOCUMENTS

CN    102141905    8/2011
EP    0214718    3/1987
(Continued)

OTHER PUBLICATIONS

Qing Guo, et al., A Resistive TCAM Accelerator for Data-Intensive Computing, MICRO'11, Dec. 3-7, 2011.*
(Continued)

*Primary Examiner* — Andrew Caldwell
*Assistant Examiner* — Emily E Larocque
(74) *Attorney, Agent, or Firm* — Brooks, Cameron & Huebsch, PLLC

(57)    ABSTRACT

The present disclosure includes apparatuses and methods related to determining population count. An example apparatus comprises an array of memory cells coupled to sensing circuitry. The apparatus can include a controller configured to cause: summing, in parallel, of data values corresponding to respective ones of a plurality of first vectors stored in memory cells of the array as a data value sum representing a population count thereof, wherein a second vector is stored as the plurality of first vectors, and wherein each first vector of the plurality of first vectors is stored in respective memory cells of the array that are coupled to a respective sense line of a plurality of sense lines; and iteratively summing, in parallel, of data value sums corresponding to the plurality of first vectors to provide a single data value sum corresponding to the second vector.

26 Claims, 14 Drawing Sheets

(56) References Cited

U.S. PATENT DOCUMENTS

| | | |
|---|---|---|
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujin et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,692,466 B2 | 4/2010 | Ahmadi |
| 7,685,365 B2 | 5/2010 | Rajwar et al. |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Sec |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |

(56) References Cited

U.S. PATENT DOCUMENTS

| | | |
|---|---|---|
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0178053 A1 | 7/2008 | Gorman et al. |
| 2008/0215937 A1 | 9/2008 | Dreibelbis et al. |
| 2008/0165601 A1 | 12/2008 | Matick et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| EP | 0847551 B1 | 12/2012 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 A1 | 5/2013 |
| WO | 2013081588 | 6/2013 |
| WO | 2013095592 | 6/2013 |

OTHER PUBLICATIONS

Engin Ipek, et al, Resistive Memories in Associative Computing, Emerging Memory Technologies, Springer Science+Business Media, New York 2014, Ch 8.*

Kostas Pagiamtzis, Content-Addressable Memory (CAM) Circuits and Architectures: A Tutorial and Survey, 2006 IEEE.*

Tim Finkbeiner, et al., Architectures for the Post-Moore Era: In-Memory Intelligence, IEEE Computer Society, 2017.*

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

(56) References Cited

OTHER PUBLICATIONS

International Search Report and Written Opinion for related PCT Application No. PCT/US2015/047406, dated Dec. 4, 2015, 13 pages.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs).

Elliot, et al., "Computational RAM: Implementing Processors in Memory", Jan.-Mar. 1999, (10 pgs.), vol. 16, Issue 1, IEEE Design and Test of Computers Magazine.

Notice of Rejection for related Korea Patent Application No. 10-2017-7008638, 26 pages.

Mano et al., "Logic and Computer Design Fundamentals", Jan. 1, 2013, retrieved from http://www.theeuropeanlibrary.org/tel4/record/resolve?provider=P020238&collection=all95&identifier=http%3A%2F%Fdata.copac.ac.uk%Fiid%2F71811582 dated Mar. 6, 2018, pp. 160-161 and 175-176.

European Search Report and Written Opinion for related EP Application No. 15838739.9, dated Mar. 14, 2018, 14 pages.

* cited by examiner

| COL C / ROW R | 0 | 1 | 2 | 3 | 4 | 5 | 6 | 7 | 8 | 9 | 10 | 11 | 12 | 13 | 14 | 15 | ... |
|---|---|---|---|---|---|---|---|---|---|---|---|---|---|---|---|---|---|
| 0 | BIT 0 | BIT 32 | BIT 64 | BIT 96 | BIT 128 | BIT 160 | BIT 192 | BIT 224 | BIT 256 | BIT 288 | BIT 320 | BIT 352 | BIT 384 | BIT 416 | BIT 448 | BIT 480 | ... |
| 1 | BIT 1 | BIT 33 | BIT 65 | BIT 97 | BIT 129 | BIT 161 | BIT 193 | BIT 225 | BIT 257 | BIT 289 | BIT 321 | BIT 353 | BIT 385 | BIT 417 | BIT 449 | BIT 481 | ... |
| 2 | BIT 2 | BIT 34 | BIT 66 | BIT 98 | BIT 130 | BIT 162 | BIT 194 | BIT 226 | BIT 258 | BIT 290 | BIT 322 | BIT 354 | BIT 386 | BIT 418 | BIT 450 | BIT 482 | ... |
| 3 | BIT 3 | BIT 35 | BIT 67 | BIT 99 | BIT 131 | BIT 163 | BIT 195 | BIT 227 | BIT 259 | BIT 291 | BIT 323 | BIT 355 | BIT 387 | BIT 419 | BIT 451 | BIT 483 | ... |
| 4 | ... | ... | ... | ... | ... | ... | ... | ... | ... | ... | ... | ... | ... | ... | ... | ... | ... |
| ... | ... | ... | ... | ... | ... | ... | ... | ... | ... | ... | ... | ... | ... | ... | ... | ... | ... |
| 28 | ... | ... | ... | ... | ... | ... | ... | ... | ... | ... | ... | ... | ... | ... | ... | ... | ... |
| 29 | BIT 29 | BIT 61 | BIT 93 | BIT 125 | BIT 157 | BIT 189 | BIT 221 | BIT 253 | BIT 285 | BIT 317 | BIT 349 | BIT 381 | BIT 413 | BIT 445 | BIT 477 | BIT 509 | ... |
| 30 | BIT 30 | BIT 62 | BIT 94 | BIT 126 | BIT 158 | BIT 190 | BIT 222 | BIT 254 | BIT 286 | BIT 318 | BIT 350 | BIT 382 | BIT 414 | BIT 446 | BIT 478 | BIT 510 | ... |
| 31 | BIT 31 | BIT 63 | BIT 95 | BIT 127 | BIT 159 | BIT 191 | BIT 223 | BIT 255 | BIT 287 | BIT 319 | BIT 351 | BIT 383 | BIT 415 | BIT 447 | BIT 479 | BIT 511 | ... |
| 32 | SUM 0 BIT 0 | SUM 32 BIT 0 | SUM 64 BIT 0 | SUM 96 BIT 0 | SUM 128 BIT 0 | SUM 160 BIT 0 | SUM 192 BIT 0 | SUM 224 BIT 0 | SUM 256 BIT 0 | SUM 288 BIT 0 | SUM 320 BIT 0 | SUM 352 BIT 0 | SUM 384 BIT 0 | SUM 416 BIT 0 | SUM 448 BIT 0 | SUM 480 BIT 0 | ... |
| 33 | SUM 0 BIT 1 | SUM 32 BIT 1 | SUM 64 BIT 1 | SUM 96 BIT 1 | SUM 128 BIT 1 | SUM 160 BIT 1 | SUM 192 BIT 1 | SUM 224 BIT 1 | SUM 256 BIT 1 | SUM 288 BIT 1 | SUM 320 BIT 1 | SUM 352 BIT 1 | SUM 384 BIT 0 | SUM 416 BIT 0 | SUM 448 BIT 0 | SUM 480 BIT 0 | ... |
| 34 | SUM 0 BIT 2 | SUM 32 BIT 2 | SUM 64 BIT 2 | SUM 96 BIT 2 | SUM 128 BIT 2 | SUM 160 BIT 2 | SUM 192 BIT 2 | SUM 224 BIT 2 | SUM 256 BIT 2 | SUM 288 BIT 2 | SUM 320 BIT 2 | SUM 352 BIT 2 | SUM 384 BIT 2 | SUM 416 BIT 0 | SUM 448 BIT 0 | SUM 480 BIT 0 | ... |
| 35 | SUM 0 BIT 3 | SUM 32 BIT 3 | SUM 64 BIT 3 | SUM 96 BIT 3 | SUM 128 BIT 3 | SUM 160 BIT 3 | SUM 192 BIT 3 | SUM 224 BIT 3 | SUM 256 BIT 3 | SUM 288 BIT 3 | SUM 320 BIT 3 | SUM 352 BIT 3 | SUM 384 BIT 3 | SUM 416 BIT 0 | SUM 448 BIT 0 | SUM 480 BIT 0 | ... |
| 36 | SUM 0 BIT 4 | SUM 32 BIT 4 | SUM 64 BIT 4 | SUM 96 BIT 4 | SUM 128 BIT 4 | SUM 160 BIT 4 | SUM 192 BIT 4 | SUM 224 BIT 4 | SUM 256 BIT 4 | SUM 288 BIT 4 | SUM 320 BIT 4 | SUM 352 BIT 4 | SUM 384 BIT 4 | SUM 416 BIT 0 | SUM 448 BIT 0 | SUM 480 BIT 0 | ... |
| 37 | SUM 0 BIT 5 | SUM 32 BIT 5 | SUM 64 BIT 5 | SUM 96 BIT 5 | SUM 128 BIT 5 | SUM 160 BIT 5 | SUM 192 BIT 5 | SUM 224 BIT 5 | SUM 256 BIT 5 | SUM 288 BIT 5 | SUM 320 BIT 5 | SUM 352 BIT 5 | SUM 384 BIT 0 | SUM 416 BIT 0 | SUM 448 BIT 0 | SUM 480 BIT 0 | ... |
| 38 | 0 | 0 | 0 | 0 | 0 | 0 | 0 | 0 | 0 | 0 | 0 | 0 | 0 | 0 | 0 | 0 | ... |
| 39 | 0 | 0 | 0 | 0 | 0 | 0 | 0 | 0 | 0 | 0 | 0 | 0 | 0 | 0 | 0 | 0 | ... |
| ... | 0 | 0 | 0 | 0 | 0 | 0 | 0 | 0 | 0 | 0 | 0 | 0 | 0 | 0 | 0 | 0 | ... |

| COL C / ROW R | 0 | 1 | 2 | 3 | 4 | 5 | 6 | 7 | 8 | 9 | 10 | 11 | 12 | 13 | 14 | 15 | ... |
|---|---|---|---|---|---|---|---|---|---|---|---|---|---|---|---|---|---|
| 32 | SUM 0 BIT 0 | SUM 32 BIT 0 | SUM 64 BIT 0 | SUM 96 BIT 0 | SUM 128 BIT 0 | SUM 160 BIT 0 | SUM 192 BIT 0 | SUM 224 BIT 0 | SUM 256 BIT 0 | SUM 288 BIT 0 | SUM 320 BIT 0 | SUM 352 BIT 0 | SUM 384 BIT 0 | SUM 416 BIT 0 | SUM 448 BIT 0 | SUM 480 BIT 0 | ... |
| 33 | SUM 0 BIT 1 | SUM 32 BIT 1 | SUM 64 BIT 1 | SUM 96 BIT 1 | SUM 128 BIT 1 | SUM 160 BIT 1 | SUM 192 BIT 1 | SUM 224 BIT 1 | SUM 256 BIT 1 | SUM 288 BIT 1 | SUM 320 BIT 1 | SUM 352 BIT 1 | SUM 384 BIT 0 | SUM 416 BIT 0 | SUM 448 BIT 0 | SUM 480 BIT 0 | ... |
| 34 | SUM 0 BIT 2 | SUM 32 BIT 2 | SUM 64 BIT 2 | SUM 96 BIT 2 | SUM 128 BIT 2 | SUM 160 BIT 2 | SUM 192 BIT 2 | SUM 224 BIT 2 | SUM 256 BIT 2 | SUM 288 BIT 2 | SUM 320 BIT 2 | SUM 352 BIT 2 | SUM 384 BIT 0 | SUM 416 BIT 0 | SUM 448 BIT 0 | SUM 480 BIT 0 | ... |
| 35 | SUM 0 BIT 3 | SUM 32 BIT 3 | SUM 64 BIT 3 | SUM 96 BIT 3 | SUM 128 BIT 3 | SUM 160 BIT 3 | SUM 192 BIT 3 | SUM 224 BIT 3 | SUM 256 BIT 3 | SUM 288 BIT 3 | SUM 320 BIT 3 | SUM 352 BIT 3 | SUM 384 BIT 0 | SUM 416 BIT 0 | SUM 448 BIT 0 | SUM 480 BIT 0 | ... |
| 36 | SUM 0 BIT 4 | SUM 32 BIT 4 | SUM 64 BIT 4 | SUM 96 BIT 4 | SUM 128 BIT 4 | SUM 160 BIT 4 | SUM 192 BIT 4 | SUM 224 BIT 4 | SUM 256 BIT 4 | SUM 288 BIT 4 | SUM 320 BIT 4 | SUM 352 BIT 4 | SUM 384 BIT 0 | SUM 416 BIT 0 | SUM 448 BIT 0 | SUM 480 BIT 0 | ... |
| 37 | SUM 0 BIT 5 | SUM 32 BIT 5 | SUM 64 BIT 5 | SUM 96 BIT 5 | SUM 128 BIT 5 | SUM 160 BIT 5 | SUM 192 BIT 5 | SUM 224 BIT 5 | SUM 256 BIT 5 | SUM 288 BIT 5 | SUM 320 BIT 5 | SUM 352 BIT 5 | SUM 384 BIT 0 | SUM 416 BIT 0 | SUM 448 BIT 0 | SUM 480 BIT 0 | ... |
| 38 | 0 | SUM 32 BIT 0 | 0 | SUM 96 BIT 0 | 0 | SUM 160 BIT 0 | 0 | SUM 224 BIT 0 | 0 | SUM 288 BIT 0 | 0 | SUM 352 BIT 0 | 0 | SUM 416 BIT 0 | 0 | SUM 480 BIT 0 | ... |
| 39 | 0 | SUM 32 BIT 1 | 0 | SUM 96 BIT 1 | 0 | SUM 160 BIT 1 | 0 | SUM 224 BIT 1 | 0 | SUM 288 BIT 1 | 0 | SUM 352 BIT 1 | 0 | SUM 416 BIT 1 | 0 | SUM 480 BIT 1 | ... |
| 40 | 0 | SUM 32 BIT 2 | 0 | SUM 96 BIT 2 | 0 | SUM 160 BIT 2 | 0 | SUM 224 BIT 2 | 0 | SUM 288 BIT 2 | 0 | SUM 352 BIT 2 | 0 | SUM 416 BIT 2 | 0 | SUM 480 BIT 2 | ... |
| 41 | 0 | SUM 32 BIT 3 | 0 | SUM 96 BIT 3 | 0 | SUM 160 BIT 3 | 0 | SUM 224 BIT 3 | 0 | SUM 288 BIT 3 | 0 | SUM 352 BIT 3 | 0 | SUM 416 BIT 3 | 0 | SUM 480 BIT 3 | ... |
| 42 | 0 | SUM 32 BIT 4 | 0 | SUM 96 BIT 4 | 0 | SUM 160 BIT 4 | 0 | SUM 224 BIT 4 | 0 | SUM 288 BIT 4 | 0 | SUM 352 BIT 4 | 0 | SUM 416 BIT 4 | 0 | SUM 480 BIT 4 | ... |
| 43 | 0 | SUM 32 BIT 5 | 0 | SUM 96 BIT 5 | 0 | SUM 160 BIT 5 | 0 | SUM 224 BIT 5 | 0 | SUM 288 BIT 5 | 0 | SUM 352 BIT 5 | 0 | SUM 416 BIT 5 | 0 | SUM 480 BIT 5 | ... |
| 44 | 0 | SUM 32 BIT 6 | 0 | SUM 96 BIT 6 | 0 | SUM 160 BIT 6 | 0 | SUM 224 BIT 6 | 0 | SUM 288 BIT 6 | 0 | SUM 352 BIT 6 | 0 | SUM 416 BIT 6 | 0 | SUM 480 BIT 6 | ... |
| 45 | 0 | 0 | 0 | 0 | 0 | 0 | 0 | 0 | 0 | 0 | 0 | 0 | 0 | 0 | 0 | 0 | ... |
| 46 | 0 | 0 | 0 | 0 | 0 | 0 | 0 | 0 | 0 | 0 | 0 | 0 | 0 | 0 | 0 | 0 | ... |
| 47 | 0 | 0 | 0 | 0 | 0 | 0 | 0 | 0 | 0 | 0 | 0 | 0 | 0 | 0 | 0 | 0 | ... |
| 48 | 0 | 0 | 0 | 0 | 0 | 0 | 0 | 0 | 0 | 0 | 0 | 0 | 0 | 0 | 0 | 0 | ... |
| 49 | 0 | 0 | 0 | 0 | 0 | 0 | 0 | 0 | 0 | 0 | 0 | 0 | 0 | 0 | 0 | 0 | ... |
| ... | 0 | 0 | 0 | 0 | 0 | 0 | 0 | 0 | 0 | 0 | 0 | 0 | 0 | 0 | 0 | 0 | ... |

*Fig. 4*

| | | 1444 | 1445 | 1456 | 1470 | 1471 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| 1475 → ✕✕ | | | | | | |
| | | 1 | 0 | 1 | 0 | 1 |
| | | 1 | 1 | 1 | 1 | 0 |

| | | | | | | | | | | |
|---|---|---|---|---|---|---|---|---|---|---|
| FF | 0 | 0 | 0 | 0 | 0 | 0 | 1 | 1 | 1 | ← 1476 |
| FT | 0 | 0 | 0 | 1 | 1 | 1 | 0 | 0 | 0 | ← 1477 |
| TF | 0 | 0 | 1 | 0 | 0 | 1 | 0 | 0 | 1 | ← 1478 |
| TT | 0 | 1 | 0 | 0 | 1 | 0 | 0 | 1 | 0 | ← 1479 |
| A | B | A | A*B | A*B̄ | A+B | B | AXB | A+B̄ | ĀXB̄ | B̄ | ← 1447 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

Rows 1476-1479 grouped as 1480.

APPARATUSES AND METHODS FOR DETERMINING POPULATION COUNT

PRIORITY INFORMATION

This application is a Non-Provisional of U.S. Provisional Application No. 62/045,257, filed Sep. 3, 2014, the contents of which are incorporated herein by reference.

TECHNICAL FIELD

The present disclosure relates generally to semiconductor memory and methods, and more particularly, to apparatuses and methods related to determining population count in a memory array using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing.

BRIEF DESCRIPTION OF THE DRAWINGS

FIG. 2 illustrates a vector arranged in a memory array in accordance with a number of embodiments of the present disclosure.

FIG. 3 illustrates an arrangement of data values in a memory array after columnar summing in accordance with a number of embodiments of the present disclosure.

FIG. 4 illustrates data value sums arranged in a memory array after horizontal summing in accordance with a number of embodiments of the present disclosure.

FIG. 14 is a logic table illustrating selectable logic operation results implemented by a sensing circuitry in accordance with a number of embodiments of the present disclosure.

DETAILED DESCRIPTION

Figure 1:
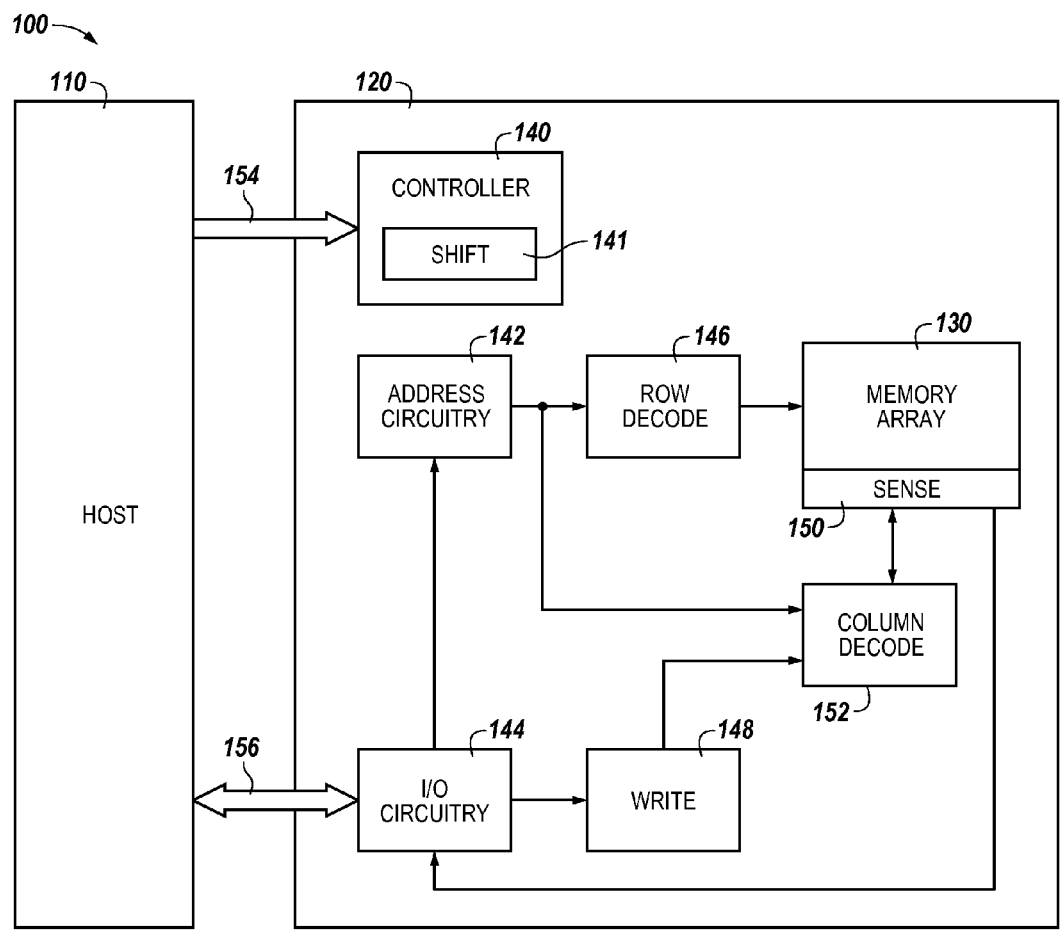
FIG. 1 is a block diagram of an apparatus in the form of an electronic system including a memory device in accordance with a number of embodiments of the present disclosure.

The present disclosure includes apparatuses and methods related to determining population count. An example apparatus comprises an array of memory cells coupled to sensing circuitry. The apparatus can include a controller configured to cause: summing, in parallel, of data values corresponding to respective ones of a plurality of first vectors stored in memory cells of the array as a data value sum representing a population count thereof, wherein a second vector is stored as the plurality of first vectors, and wherein each first vector of the plurality of first vectors is stored in respective memory cells of the array that are coupled to a respective sense line of a plurality of sense lines; and iteratively summing, in parallel, of data value sums corresponding to the plurality of first vectors to provide a single data value sum corresponding to the second vector.

A vector is an ordered collection of data values (e.g., digits, bits, etc.). As an example, a vector comprising 512 data values can be stored in a memory array, with each data value being stored in a different memory cell of the memory array. As such, the data values of the vector can be stored (e.g., arranged) in the memory array in a variety of ways. For example, a 512 bit vector can be arranged such that the bits are stored in memory cells coupled to an access line (e.g., row) and to sense lines (e.g., columns), or such that the 512 bits are stored in memory cells coupled to a single column and to 512 rows, or in other configurations involving 512 memory cells of multiple rows and/or multiple columns (e.g., 32 rows and 16 columns).

A quantity of particular data values can be referred to as a population count. As an example, in a string of bits, a population count can be the quantity of bits having a data value of "1" (e.g., logical "1" data state), which is also the sum of the string of bits. Population count can also be referred to as a "popcount" or "sideways sum."

The population count of a vector (e.g., digit string) can be of interest in cryptography and other applications. The population count may also be of interest in determining the Hamming weight of a string, which is the number of symbols that are different from the zero-symbol of the alphabet used. The Hamming weight is equivalent to the Hamming distance from the all-zero string of the same length. The Hamming distance of two words A and B can be calculated as the Hamming weight of A XOR B. Also, the quantity of data values (e.g., bits) of "0" can be determined (e.g., counted) if of interest, for example, in evaluation of matrix sparsity.

Performing logical operations, in parallel, using the sensing circuitry coupled to columns of a memory array, can be employed to rapidly and efficiently determine a population count of a vector stored in the memory array. According to various embodiments of the present disclosure, a vector can be stored in a memory array as a plurality of smaller vectors. Each smaller vector can be stored in a column of the memory array (e.g., depicted in a vertical direction). The population count of the smaller vectors can each be determined by adding the contents of the memory cells storing the digits of the smaller vector using the sensing circuitry associated with the column. The result can be stored, for example, as a binary representation of the quantity in other rows of the column. The population counts of the multiple smaller vectors can be determined simultaneously in this manner where each column is equipped with sensing circuitry capable of performing logical operations. Thereafter, pairs of the population count of the smaller vectors can be added together, for example, using shifting and adding capabilities of the sensing circuitry, and pairs of those sums can be subsequently added together in a number of iterations until a single total resultant sum is obtained.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the processing resource.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 506 may reference element "06" in FIG. 5, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 5.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

The controller 140 can include a shift controller 141 that can control signals provided to, for instance, shift circuitry in association with performing data shifting as described further herein. For example, the shift controller 141 can control shifting data (e.g., right or left) in an array.

Examples of the sensing circuitry 150 are described further below. For instance, in a number of embodiments, the sensing circuitry 150 can comprise a number of sense amplifiers (e.g., sense amplifier 506 shown in FIG. 5 or sense amplifier 606 shown in FIG. 6) and a number of compute components (e.g., compute component 531-1 shown in FIG. 5), which may serve as, and be referred to herein as, an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
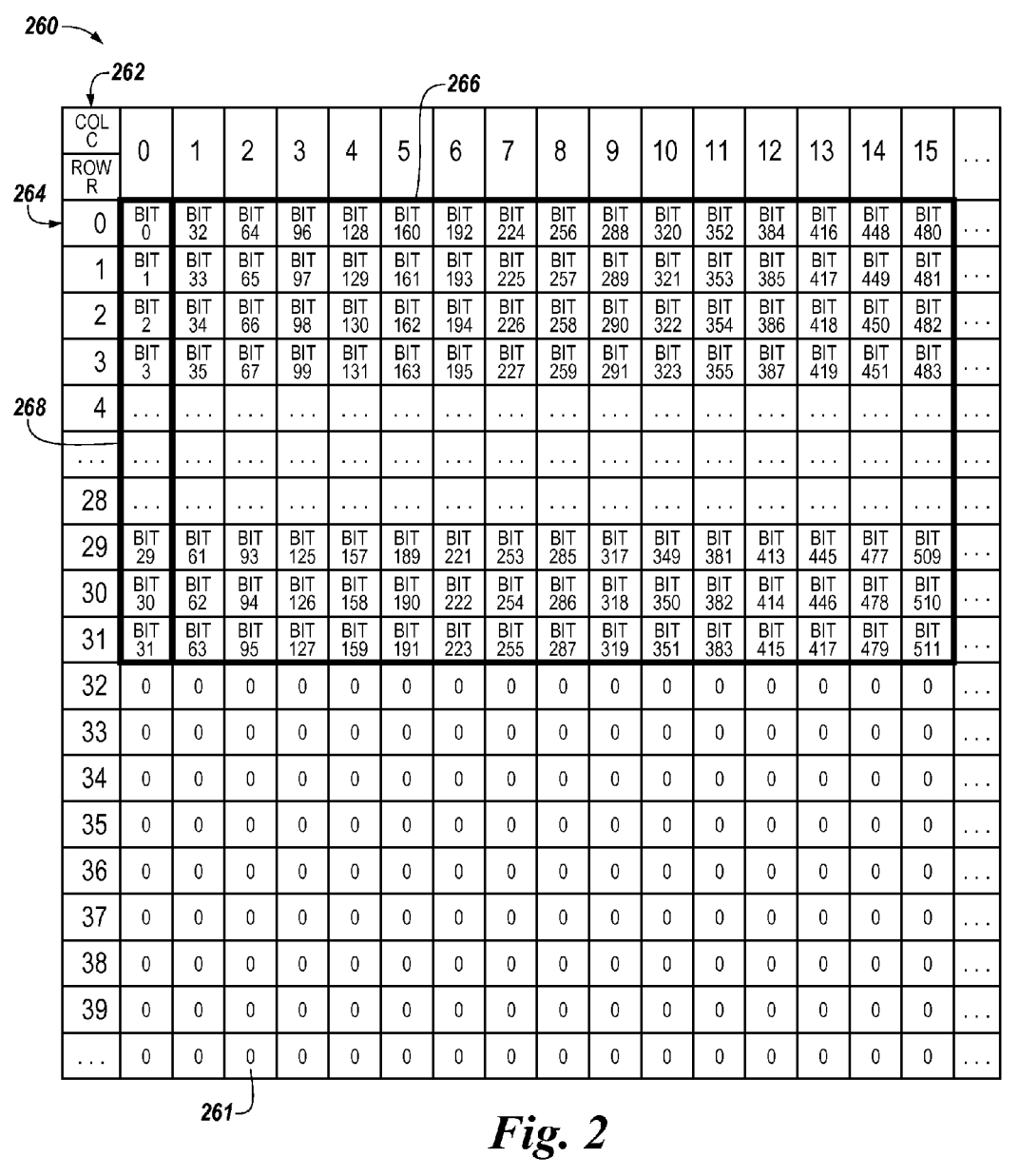

FIG. 2 illustrates a vector 266 arranged in a memory array 260 in accordance with a number of embodiments of the present disclosure. FIG. 2 shows a memory array 260 having memory cells 261 arranged into a number of columns 262 (e.g., C columns) and a number of rows 264 (e.g., R rows). An example N-bit vector 266 (e.g., 512-bit vector comprising bits 0 to 511) can be stored in the memory array 260 with one digit of the vector 266 being stored per memory cell of the memory array 260. The vector 266 can be arranged to be stored in C columns and R rows of the memory array, where C×R is greater than or equal to N.

FIG. 2 shows that vector 266 can be stored as a number of smaller M-bit vectors 268 (e.g., where M is less than N). The smaller vectors 268 can be stored in respective columns of the memory array 260 (e.g., vertically). As such, the smaller M-bit vectors can also be referred to herein as vertical bit vectors. Vertical bit vectors can also be referred to as vertical vectors, although physical implementations of columns in a memory array may not be oriented vertically, columns are generally depicted in 2-dimensions as being oriented vertically. As used herein, columns refer to the arrangement of memory cells that are coupled to a particular sense line, which in turn is coupled to an associated sensing circuitry. As shown in FIG. 2, the 512-bit vector 266 can be stored as sixteen (16) 32-bit vectors 268, corresponding to columns 0-15.

Certain efficiencies can be gained by storing a vector in a memory array using as few rows as possible to minimize logical operations associated with columnar addition. Stated in another way, certain efficiencies can be gained by storing a vector in as many columns as possible so as to minimize the quantity of rows (e.g., arrangement of memory cells that are coupled to a particular sense line word line). Certain efficiencies can further be gained by storing a vector in C columns where C is a power of 2 and/or to avoid having C be odd since horizontal additions of the present method can involve pairs of addends. According to various embodiments of the present disclosure, a vector can be stored in a memory array using as few rows as possible and using C columns where C is a power of 2 (e.g., 2 columns, 4 columns, 16 columns, etc.)

FIG. 3 illustrates an arrangement of data values in a memory array after columnar summing in accordance with a number of embodiments of the present disclosure. Performing various logical operations using sensing circuitry is discussed in detail below with respect to FIGS. 5-12. For purposes of the discussion of FIGS. 3 and 4 in regards to determining population count of a vector, sensing circuitry is associated with each column of memory cells and is configured to implement addition of data values stored in memory cells, and storing the resultant data value sum back to memory cells of the memory array. Also, shifting circuitry can be used in conjunction with the sensing circuitry to shift operands and/or resultants of a logical operation such that the contents of memory cells in other (e.g., adjacent columns) can be used in the logical operations and/or resultants of the logical operations can be stored to memory cells in columns adjacent to the column to which the sensing circuitry is associated (e.g., coupled in a normal configuration). An addend is an operand of an AND logical operation.

According to various embodiments of the present disclosure, a population count of vertical bit vectors (e.g., 368-0, 368-15) can be determined, for example, by successively summing (e.g., adding) the data values stored in the memory cells of the vertical bit vectors and storing the resultant data value sum back to the memory array. The data values for a plurality of vertical bit vectors can be summed in parallel.

The sensing circuitry is configured to sum, in parallel, data values stored in memory cells coupled to a number of the plurality of sense lines and to a number of access lines of the array to determine data value sums corresponding to each respective one of the number of sense lines. For example, the data value of each memory cell of an M-bit vertical bit vector can be summed with a data value sum stored in $\log_2$ (M) memory cells, the data value sum being a data value sum of a quantity such as the population count of the M-bit vertical bit vector.

According to some embodiments the data value sums (e.g., population count) can be stored back to memory cells in the same column in which data values of the vertical bit vector is stored. As previously mentioned, a population count of a binary string (e.g., a quantity of data values in the string having a "1" logical value), such as a vertical bit vector, can be determined by summing each of the data values of the string together. Data values having a "1" logical value will increment the sum and data values having a "0" logical value will not increment the sum.

FIG. 3 shows a bit vector comprising 512 bits (e.g., shown as "BIT 0" through "BIT 511") being stored as a number of vertical bit vectors 368-0, . . . , 368-15 (referred to generally as vertical bit vectors 368) in rows 0-31 of each column and a data value sum (e.g., binary number stored as bit vectors 370-0, . . . , 370-15 and referred to generally as data value sums 370) of the quantity of the population count corresponding to the vertical bit vector 368 of a particular column being stored immediately below the respective vertical bit vector 368 in each column. For example, the data value sum 370-0 of the population count of vertical bit vector 368-0 is stored in column 0 immediately below vertical bit vector 368-0, and the data value sum 370-15 of the population count of vertical bit vector 368-15 is stored in column 15 immediately below vertical bit vector 368-15. FIG. 3 similarly shows the data value sum 370 of the population count of a vertical bit vector 368 being stored in the corresponding column immediately below the respective vertical bit vector 368.

However, embodiments of the present disclosure are not so limited, and the data value sum 370 of the population count of a particular vertical bit vector 368 need not be stored in the same column as the vertical bit vector 368, need not be stored immediately below the vertical bit vector 368, and need not even be stored below the vertical bit vector 368. For example, a data value sum 370 of the population count of a particular vertical bit vector 368 may be stored in another column, in a row, in a same column above the vertical bit vector 368, or stored further below the vertical bit vector 368 than immediately therebelow.

FIG. 3 shows the data value sum 370 of the population count of a particular vertical bit vector 368 being arranged such that a least significant bit (e.g., bit 0) is stored in a memory cell of the array of memory cells immediately below the particular vertical bit vector 368, and successively more significant bits of the data value sum 370 of the population count being stored therebelow. However, embodiments of the present disclosure are not so limited, and the arrangement of the data value sum 370 can be different than that shown (e.g., with a most significant bit being stored closest to the particular vertical bit vector 368 or other arrangement). Also, data values of the vertical bit vector 368 and/or data value sum 370 are not limited to binary data values, and can be other multiple-state data values stored in multiple-state memory cells. FIG. 3 shows an example utilizing binary data values (i.e., bits) for simplicity and clarity.

According to various embodiments of the present disclosure, the length of the vertical bit vector (e.g., number of rows used to store the vertical bit vector) is not limited to being 32 bits, as is shown in FIG. 3. The vertical bit vector can be of any length that can be accommodated by the array of memory cells. Nor is the length of the data value sum limited to 6 data values, and can be more or fewer depending on the quantity of data values in the vertical bit vector. The data value sum can be of sufficient length to represent a maximum population count for a particular vertical bit vector. For example, a 32-bit vertical bit vector (e.g., 368-0) can have a maximum population count of 32 (e.g., if all data values of the vertical bit vector are a "1" logical value). Therefore, the data value sum for a binary representation of 32 requires 6 bits since $\log_2 (32)=6$.

Although FIG. 3 shows the resultant binary number representing the population count being stored in the same column as the vertical bit vector 368 from which the population count is determined, embodiments of the present disclosure are not so limited and the resultant can be stored in other arrangements, such as in an adjacent column (e.g., in preparation for a subsequent addition) or in another C quantity of columns located in another portion of the memory array.

Summing the data values stored in the memory cells of the vertical bit vectors 368 can be accomplished using the sensing circuitry of the PIM architecture shown below with respect to FIGS. 5 and 6. For each example M-bit (e.g., 32-bit) vector 368 stored in respective columns, the quantity of those digits having a "1" logical state can range from zero to 32. As such, $\log_2 (M)$ memory cells (rounded-up to the next integer) can contain the resultant population count represented as a binary number. In the example shown in FIG. 3, $\log_2 (32)=6$ memory cells are allocated to store the resultant population count of the M-digit vector for each column, the data value sum of population count of each vertical bit vector 368 being stored in rows 32-37.

Mathematical addition, a higher level operation, can be accomplished using logical operations. Let Sa and Sb be two single bit addends. Let Ci be a carry input. The sum output, So, and carry output, Co, can be determined by the following Boolean equations:

$$So = Ci \wedge Sa \wedge Sb$$

$$Co = Sa \cdot Sb + Sa \cdot Ci + Sb \cdot Ci$$

where "·" denotes a Boolean AND, "+" denotes a Boolean OR, and "^" denotes a Boolean XOR (e.g., exclusive OR). As is discussed further below with respect to FIGS. 5-12, individual logical operations (e.g., Boolean logical operations) can be implemented using the sensing circuitry coupled to the memory array. An XOR function can be implemented in a variety of ways including by implementing equivalent Boolean algebraic expressions involving NOT, AND and/or OR logical operations such as A·NOT(B)+NOT(A)·B and (A+B)·NOT(A·B), among others where A and B are the operands of the XOR logical operations. That is, apparatus that can implement NOT, AND, and OR logical operations, such as that described with respect to FIG. 5-12, can be used to implement XOR and other logical operations that have equivalent Boolean expressions involving NOT, AND, and OR logical operations.

An example of pseudo code for a multi-bit addition can be summarized as follows. Each of Ci, Co, Sa, and Sb represent the data value of a memory cell. The details of how to implement loading a data value from a memory cell associated with a particular row of the column to the sensing circuitry, saving a data value from the sensing circuitry to a memory cell, performing logical operations between two operands, and/or shifting operations between adjacent columns will better be understood with respect to the discussions that follow regarding FIG. 5-12.

As is described with respect to FIG. 5-12, several methods can be used to perform same logical operations with the result being initially stored in the sense amplifier, or being initially stored in the accumulator of the sensing circuitry. As such, the operations described here refer to the sensing circuitry, which intends the appropriate portion of the sensing circuitry depending on the particular one of several methods being used to perform the particular logical operation. For example, some action to move a data value "into the sensing circuitry" can mean moving the data value to the accumulator using one mode of operating the sensing circuitry, or can mean moving the data value to a sense amplifier using another mode of operating the sensing circuitry. The below pseudocode describes an example multi-bit addition operation:

Load Ci into the sensing circuitry;
Save sensing circuitry (Ci) to a temp row (Ci also still residing in the sensing circuitry);
XOR Sa into the sensing circuitry (Sa^Ci);
Shift to align data, if necessary;
XOR Sb into the sensing circuitry (Sb^(Sa^Ci));
Shift to align data, if necessary;
Save sensing circuitry in So;
Load sensing circuitry with Sa (replacing previous data value in sensing circuitry);
Shift to align data, if necessary;
AND Sb into sensing circuitry (Sb·Sa);
Shift to align data, if necessary;
Save sensing circuitry into a second temp row (Co);
Load sensing circuitry from temp row (Ci);
AND Sa into the sensing circuitry;
Save sensing circuitry to temp row (Co);
Load sensing circuitry from temp row (Ci);
Shift to align data, if necessary;
AND Sb into the sensing circuitry;
Shift to align data, if necessary;
OR the temp row (Co) into the sensing circuitry;
Increment the Sa, Sb, and So row addresses;
If not at the end of the multi-bit add, return above to Save sensing circuitry (Ci) to a temp row;
If at the end of the multi-bit addition, save sensing circuitry into So;

The shift operations to align data, if necessary, are used if the two addends are not in the same column, as may be the case if the data values involved in the mathematical addition are stored in a different column than the vertical bit vector (which is not the case for the example shown in FIG. 3 but is the case for subsequent additions such as those discussed with respect to FIG. 4 below). That is, the data value sums can be stored in memory cells coupled to access lines other than the number of access lines to which memory cells storing the data values (e.g., summed to determine the data value sum) are coupled. Since the addends are all located in the same column for the example shown in FIG. 3, the shift operations can be omitted in determining the population count for the 32-bit vectors 368 in each column.

The pseudo code for a multi-bit addition summarized above can be used to add the data value of one memory cell to the data value sum of the quantity of the population count for the vertical bit vector. However, the vertical bit vector (e.g., 368) can be comprised of M-bits (e.g., 32 for the example illustrated in FIG. 3). As such, each of the 32 data values of the vertical bit vector 368 can be added to the total population count represented by the multi-bit data value sum 370 corresponding to the column. That is, the above-detailed addition can be repeated 32 times to account for each of the data values of the vertical bit vectors 368 comprising the 512-bit vector described in association with FIG. 2.

Figure 5:
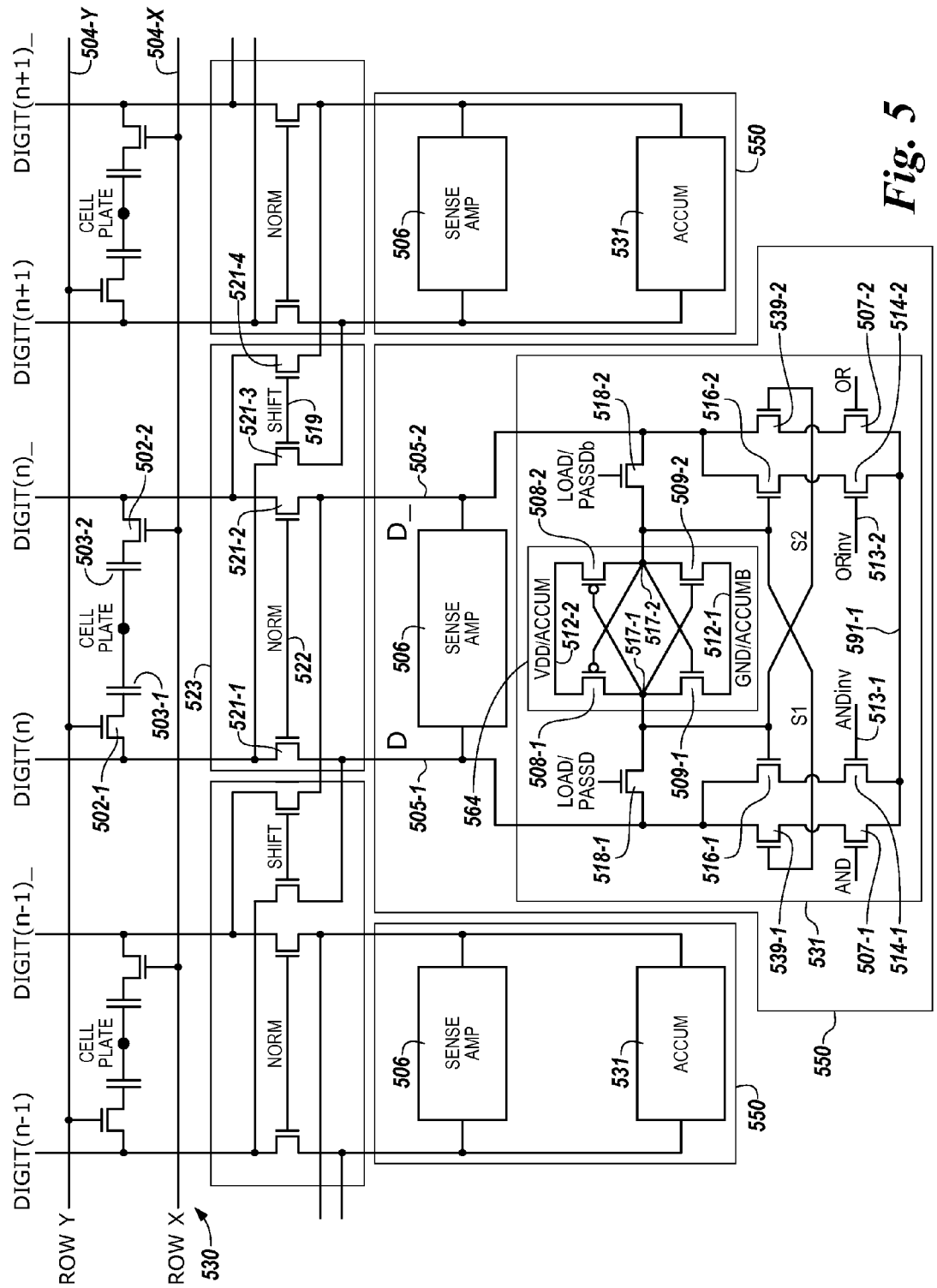
FIG. 5 is a schematic diagram illustrating sensing circuitry in accordance with a number of embodiments of the present disclosure.

The population count of the M-digit (e.g., columnar) vector can be determined by performing logical operations involving various memory cells in the column. For an M-digit vector in a column, M additions can be utilized to determine the population count (e.g., adding each digit of the M-digit vector to a binary total). One method for implementing the addition of the digits comprising an M-bit vector stored in a column can be as follows:

Let Src be the starting row address of an M-bit vector stored in a column;
Let Cnt be the starting row address of a [$\log_2$ (M)]-bit data value sum of a columnar population count for the M-bit vector;
Let Sx be the starting row address of a [$\log_2$ (M)]-bit columnar scratch area that can be set to zero;
Loop to clear the $\log_2$ (M) Cnt address rows;
Loop to clear Sx scratch rows;
Load Src into the sensing circuitry;
Do the multi-bit columnar add with Cnt being Sa, and Sx being Sb;
Increment the Src row addresses;
If not at the end of the M-bit vertical bit vector, return to Load another Src into the sensing circuitry;

As will be appreciated with respect to the discussion of FIG. 5, each column of the memory array is coupled to an associated sensing circuitry (e.g., sense amplifier and compute component), which can be utilized to perform logical operations in parallel and thus simultaneously determine the population count for each of the 16 32-bit vectors 368 shown in the example illustrated in FIG. 3. The 16 6-bit sums that quantify the population count of the 32-bit vectors 368 stored in rows 0-31 of the corresponding column are shown in FIG. 3 being stored back into the memory array in rows 32-37 (e.g., as sums 370).

FIG. 4 illustrates data value sums arranged in a memory array after horizontal summing in accordance with a number of embodiments of the present disclosure. Data value sums (e.g., sums 370-0 and 370-1 representing a population count of particular vertical bit vectors 368-0 and 368-1) can be summed to determine a resultant sum (e.g., 472-1) representing a population count corresponding to the data values stored in the memory cells coupled to the number of the plurality of sense lines and to the number of access lines. For example, a first iteration of horizontal summing can sum a pair (e.g., 2) of data value sums to determine an updated data value sum. A pair of updated data value sums can be summed in a second iteration of horizontal summing to determine an updated updated data value sum, and so on until only a single data value sum remains that represents the population counts of each of the vertical bit vectors, and thus the population count of an initial vector (e.g., the 512-bit vector described in association with FIG. 2) that was stored as a plurality of vertical bit vectors (e.g., bit vectors 368 described in FIG. 3). Summing of data value sums, updated data value sums, etc., can continue responsive to the number of data value sums, updated data value sums being greater than one. The updated updated data value sums can be in memory cells coupled to respective ones of the number of sense lines to which one of the updated data value sums correspond, or in memory cells coupled to other sense lines (e.g., sense lines to which no updated data value sums correspond).

After the 16 6-bit data value sums (e.g., sums 370 shown in FIG. 3) quantifying the population count of each of the 32-bit vectors (e.g., 368 shown in FIG. 3) stored in rows 0-31 of the corresponding column are determined, the data value sums are subsequently summed in $\log_2$ (C) logical addition operations, where C is the quantity of vertical bit vectors (e.g., 368). In other words, after the population count for the vertical bit vectors are determined, the population counts are added together to arrive at the total population count for the original vector (e.g., the 512-bit vector shown in FIG. 2 stored in columns 0-15 and rows 0-31).

FIG. 4 shows the 6-bit data value sums of the population count of respective vertical bit vectors (e.g., 470-0 for column 0, 470-1 for column 1) stored in rows 32-37 for each column, just as was shown in FIG. 3. FIG. 4 additionally shows a 7-bit data value sum of a population count 472-1, which can be a sum of the data value sums of the population count 470-0 for column 0 and the data value sums of the population count 470-1 for column 1. That is, the multi-bit data value sums of the population count 470-0 for column 0 can be added to the data value sums of the population count 470-1 for column 1, with the result being the data value sum 472-1 shown stored in rows 38-44 of column 1. Alternatively, the data value sum 472-1 shown stored in rows 38-44 of column 1 can be initially zeroed, after which each of the data value sums of the population count 470-0 for column 0 and the data value sums of the population count 470-1 for column 1 can be added thereto.

It should be noted that in the example illustrated in FIG. 4, data value sum 472-1 is a 7-bit binary number whereas each of the data value sums 470-0 and 470-1 are 6-bit numbers. The maximum population count for each of the 32-bit vertical bit vectors is 32; therefore, data value sum 472-1 for a sum result may have to represent a maximum value of 2×32 or 64. $\log_2$ (64)=7 so 7 digits are necessary for the data value sum 472-1.

FIG. 4 further shows that pairs of the 16 data value sums of population counts for the vertical bit vectors (e.g., 470-0 and 470-1) are added together and stored in a new data value sum of the sum (e.g., 472-1). The addition of the multi-bit data value sums of the population counts for the vertical bit vectors can be accomplished as described above. However, since the data value sums of the population counts for pairs of vertical bit vectors are stored in different columns, the shifting operations shown in the pseudo code above can be used to move the data values into the sensing circuitry of an adjacent column. Shifting operations are discussed in more detail below with respect to FIG. 5.

The addition of two multi-bit data value sums (e.g., 470-0 and 470-1) stored in adjacent columns (e.g., columns 0 and 1, respectively) can be accomplished by the sensing circuitry of either of the two columns. However, the addition of two multi-bit data value sums stored in adjacent columns can be most efficiently accomplished by the sensing circuitry associated with the column in which the resultant data value sum (e.g., 472-1) is going to be stored (e.g., column 1 for the example shown in FIG. 4) so as to eliminate a shifting operation to accomplish the storing.

The addition of two multi-bit data value sums stored in adjacent columns can be referred to herein as horizontal addition or horizontal summing. As can be observed in FIG. 4, a first iteration of horizontal addition that adds pairs of the 6-bit data value sums of population count of 16 vertical bit vectors together results in 8 new 7-bit data value sums. These 8 additions can be accomplished simultaneously utilizing the PIM sensing circuitry of the present disclosure.

Another iteration of multi-bit addition can add pairs of the 8 7-bit data value sums together and store the resulting data value sums in 4 8-bit data value sums. Additional adding iterations can result in 2 9-bit data value sums, and then 1 10-bit data value sum of the total population count for all of the vertical bit vectors, which is also the population count for the original 512-bit vector. That is, for 16 vertical bit vectors 4 horizontal addition operations will result in a singular data value sum of total population count. More generally, $\log_2$ (C) horizontal addition operations are used to sum the data value sums of population count corresponding to vertical bit vectors stored in C columns.

The efficiency of storing the original vector so as to minimize the quantity of rows and maximize the quantity of columns should be apparent since r addition operations are used to add r elements of a vertical bit vector, but only $\log_2$ (C) horizontal additions are used to add the data value sums of population count for each column. Alternatively stated, 1 summing operation is used for each element of a vertical bit vector and $\log_2$ (C) summing operations are used to add the population counts for each of C vertical bit vectors. For another example, the population count of a vector stored in 16,384 columns and 256 rows of a memory array, each column having a sensing circuitry, can be determined in 256+log2 (16,384)=256+14=270 addition operations.

The $\log_2$ (C) addition operations to arrive at a total population count reflects that iterative additions can be implemented to add pairs of population counts together until a single final sum is determined. Utilizing the PIM sensing circuitry of the present disclosure, multiple pairs of population counts can be added together simultaneously, in parallel, with each iteration of horizontal addition. The result of a first iteration of adding pairs of the 16 6-bit sums quantifying the population count of the 32-bit vectors is shown in FIG. 4.

While FIG. 4 shows a result of horizontal addition being stored immediately below the addend in the right-most column, embodiments of the present disclosure are not so limited. The result of horizontal addition can be stored in a different location than that shown for the example illustrated in FIG. 4, in manners similar to that discussed for the data value sums 370 shown in FIG. 3. Also, the arrangement with respect to least significant bit and most significant bit of a numerical result (e.g., 472-1) can be different than that shown in FIG. 4.

FIG. 5 is a schematic diagram illustrating sensing circuitry in accordance with a number of embodiments of the present disclosure. A memory cell comprises a storage element (e.g., capacitor) and an access device (e.g., transistor). For instance, transistor 502-1 and capacitor 503-1 comprises a memory cell, and transistor 502-2 and capacitor 503-2 comprises a memory cell, etc. In this example, the memory array 530 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 530 are arranged in rows coupled by word lines 504-X (Row X), 504-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 505-1 (D) and 505-2 (D_) respectively. Although only three pair of complementary data lines are shown in FIG. 5, embodiments of the present disclosure are not so limited, and an array of memory cells can include additional columns of memory cells and/or data lines (e.g., 4,096, 8,192, 6,384, etc.).

Memory cells can be coupled to different data lines and/or word lines. For example, a first source/drain region of a transistor 502-1 can be coupled to data line 505-1 (D), a second source/drain region of transistor 502-1 can be coupled to capacitor 503-1, and a gate of a transistor 502-1 can be coupled to word line 504-Y. A first source/drain region of a transistor 502-2 can be coupled to data line 505-2 (D_), a second source/drain region of transistor 502-2 can be coupled to capacitor 503-2, and a gate of a transistor 502-2 can be coupled to word line 504-X. The cell plate, as shown in FIG. 5, can be coupled to each of capacitors 503-1 and 503-2. The cell plate can be a common node to which a reference voltage (e.g., ground) can be applied in various memory array configurations.

The memory array 530 is coupled to sensing circuitry 550 in accordance with a number of embodiments of the present disclosure. In this example, the sensing circuitry 550 comprises a sense amplifier 506 and a compute component 531 corresponding to respective columns of memory cells (e.g., coupled to respective pairs of complementary data lines). The sense amplifier 506 can comprise a cross coupled latch, which can be referred to herein as a primary latch. The sense amplifier 506 can be configured, for example, as described with respect to FIG. 6.

In the example illustrated in FIG. 5, the circuitry corresponding to compute component 531 comprises a static latch 564 and an additional ten transistors that implement, among other things, a dynamic latch. The dynamic latch and/or static latch of the compute component 531 can be collectively referred to herein as a secondary latch, which can serve as an accumulator. As such, the compute component 531 can operate as and/or be referred to herein as an accumulator. The compute component 531 can be coupled to each of the data lines D 505-1 and D_ 505-2 as shown in FIG. 5. However, embodiments are not limited to this example. The transistors of compute component 531 can all be re-channel transistors (e.g., NMOS transistors), for example.

In this example, data line D 505-1 can be coupled to a first source/drain region of transistors 516-1 and 539-1, as well as to a first source/drain region of load/pass transistor 518-1. Data line D_ 505-2 can be coupled to a first source/drain region of transistors 516-2 and 539-2, as well as to a first source/drain region of load/pass transistor 518-2.

The gates of load/pass transistor 518-1 and 518-2 can be commonly coupled to a LOAD control signal, or respectively coupled to a PASSD/PASSDB control signal, as discussed further below. A second source/drain region of load/pass transistor 518-1 can be directly coupled to the gates of transistors 516-1 and 539-2. A second source/drain region of load/pass transistor 518-2 can be directly coupled to the gates of transistors 516-2 and 539-1.

A second source/drain region of transistor 516-1 can be directly coupled to a first source/drain region of pull-down transistor 514-1. A second source/drain region of transistor 539-1 can be directly coupled to a first source/drain region of pull-down transistor 507-1. A second source/drain region of transistor 516-2 can be directly coupled to a first source/drain region of pull-down transistor 514-2. A second source/drain region of transistor 539-2 can be directly coupled to a first source/drain region of pull-down transistor 507-2. A second source/drain region of each of pull-down transistors 507-1, 507-2, 514-1, and 514-2 can be commonly coupled together to a reference voltage line 591-1 (e.g., ground (GND)). A gate of pull-down transistor 507-1 can be coupled to an AND control signal line, a gate of pull-down transistor 514-1 can be coupled to an ANDinv control signal line 513-1, a gate of pull-down transistor 514-2 can be coupled to an ORinv control signal line 513-2, and a gate of pull-down transistor 507-2 can be coupled to an OR control signal line.

The gate of transistor 539-1 can be referred to as node S1, and the gate of transistor 539-2 can be referred to as node S2. The circuit shown in FIG. 5 stores accumulator data dynamically on nodes S1 and S2. Activating the LOAD control signal causes load/pass transistors 518-1 and 518-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 5 is not contingent on the LOAD control signal being elevated to a voltage greater than $V_{DD}$.

The configuration of compute component 531 shown in FIG. 5 has the benefit of balancing the sense amplifier for functionality when the pull-down transistors 507-1, 507-2, 514-1, and 514-2 are conducting before the sense amplifier 506 is fired (e.g., during pre-seeding of the sense amplifier 506). As used herein, firing the sense amplifier 506 refers to enabling the sense amplifier 506 to set the primary latch and subsequently disabling the sense amplifier 506 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 516-1 (having a gate coupled to S2 of the dynamic latch) in series with transistor 514-1 (having a gate coupled to an ANDinv control signal line 513-1) can be operated to pull-down data line 505-1 (D), and transistor 516-2 (having a gate coupled to S1 of the dynamic latch) in series with transistor 514-2 (having a gate coupled to an ANDinv control signal line 513-2) can be operated to pull-down data line 505-2 (D_).

The latch 564 can be controllably enabled by coupling to an active negative control signal line 512-1 (ACCUMB) and an active positive control signal line 512-2 (ACCUM) rather than be configured to be continuously enabled by coupling to ground and $V_{DD}$. In various embodiments, load/pass transistors 508-1 and 508-2 can each having a gate coupled to one of a LOAD control signal or a PASSD/PASSDB control signal.

According to some embodiments, the gates of load/pass transistors 518-1 and 518-2 can be commonly coupled to a LOAD control signal. In the configuration where the gates of load/pass transistors 518-1 and 518-2 are commonly coupled to the LOAD control signal, transistors 518-1 and 518-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 5 is not contingent on the LOAD control signal being elevated to a voltage greater than $V_{DD}$.

According to some embodiments, the gate of load/pass transistor 518-1 can be coupled to a PASSD control signal, and the gate of load/pass transistor 518-2 can be coupled to a PASSDb control signal. In the configuration where the gates of transistors 518-1 and 518-2 are respectively coupled to one of the PASSD and PASSDb control signals, transistors 518-1 and 518-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 523, as shown in FIG. 5). According to some embodiments, load/pass transistors 518-1 and 518-2 can be configured to accommodate the heavier loading corresponding to a pass transistor but be coupled and operated as a load transistor. Load/pass transistors 518-1 and 518-2 configured as pass transistors can also be utilized as load transistors. However, load/pass transistors 518-1 and 518-2 configured as load transistors may not be capable of being utilized as pass transistors.

In a number of embodiments, the compute component 531, including the latch 564, can comprise a number of transistors formed on pitch with the transistors of the corresponding memory cells of an array (e.g., array 530 shown in FIG. 5) to which they are coupled, which may conform to a particular feature size (e.g., $4F^2$, $6F^2$, etc.). According to various embodiments, latch 564 includes four transistors 508-1, 508-2, 509-1, and 509-2 coupled to a pair of complementary data lines D 505-1 and D_ 505-2 through load/pass transistors 518-1 and 518-2. However, embodiments are not limited to this configuration. The latch 564 can be a cross coupled latch (e.g., gates of a pair of transistors, such as n-channel transistors (e.g., NMOS transistors) 509-1 and 509-2 are cross coupled with the gates of another pair of transistors, such as p-channel transistors (e.g., PMOS transistors) 508-1 and 508-2). As described further herein, the cross coupled latch 564 can be referred to as a static latch.

The voltages or currents on the respective data lines D and D_ can be provided to the respective latch inputs 517-1 and 517-2 of the cross coupled latch 564 (e.g., the input of the secondary latch). In this example, the latch input 517-1 is coupled to a first source/drain region of transistors 508-1 and 509-1 as well as to the gates of transistors 508-2 and 509-2. Similarly, the latch input 517-2 can be coupled to a first source/drain region of transistors 508-2 and 509-2 as well as to the gates of transistors 508-1 and 509-1.

Figure 6:
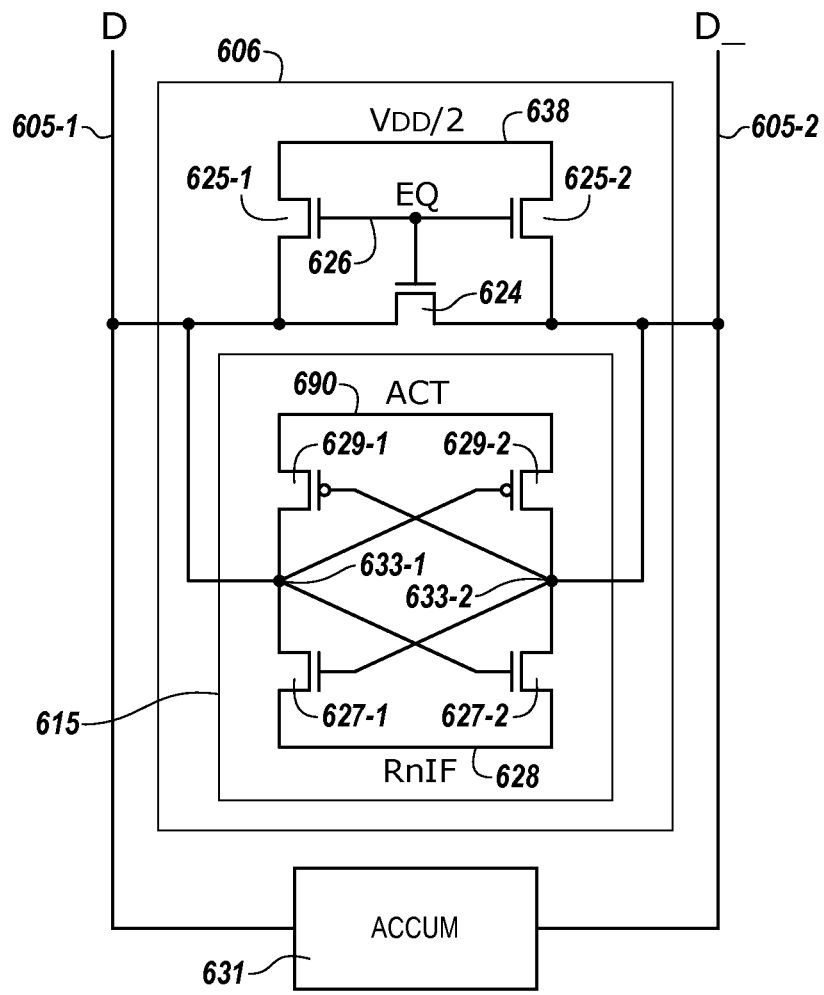
FIG. 6 is a schematic diagram illustrating a portion of sensing circuitry in accordance with a number of embodiments of the present disclosure.

In this example, a second source/drain region of transistor 509-1 and 509-2 is commonly coupled to a negative control signal line 512-1 (e.g., ground (GND) or ACCUMB control signal similar to control signal RnIF shown in FIG. 6 with respect to the primary latch). A second source/drain region of transistors 508-1 and 508-2 is commonly coupled to a positive control signal line 512-2 (e.g., $V_{DD}$ or ACCUM control signal similar to control signal ACT shown in FIG. 6 with respect to the primary latch). The positive control signal 512-2 can provide a supply voltage (e.g., $V_{DD}$) and the negative control signal 512-1 can be a reference voltage (e.g., ground) to enable the cross coupled latch 564. According to some embodiments, the second source/drain region of transistors 508-1 and 508-2 are commonly coupled directly to the supply voltage (e.g., $V_{DD}$), and the second source/drain region of transistor 509-1 and 509-2 are commonly coupled directly to the reference voltage (e.g., ground) so as to continuously enable latch 564.

The enabled cross coupled latch 564 operates to amplify a differential voltage between latch input 517-1 (e.g., first common node) and latch input 517-2 (e.g., second common node) such that latch input 517-1 is driven to either the activated positive control signal voltage (e.g., $V_{DD}$) or the activated negative control signal voltage (e.g., ground), and latch input 517-2 is driven to the other of the activated positive control signal voltage (e.g., $V_{DD}$) or the activated negative control signal voltage (e.g., ground).

FIG. 6 is a schematic diagram illustrating a portion of sensing circuitry in accordance with a number of embodiments of the present disclosure. According to various embodiments, sense amplifier 606 (e.g., corresponding to sense amplifier 506 shown in FIG. 5) can comprise a cross coupled latch. However, embodiments of the sense amplifier 606 are not limited to a cross coupled latch. As an example, the sense amplifier 606 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 606) can comprise a number of transistors formed on pitch with the transistors of the corresponding compute component 631 and/or the memory cells of an array (e.g., 530 shown in FIG. 5) to which they are coupled, which may conform to a particular feature size (e.g., $4F^2$, $6F^2$, etc.). The sense amplifier 606 comprises a latch 615 including four transistors coupled to a pair of complementary data lines D 605-1 and D_ 605-2. The latch 615 can be a cross coupled latch (e.g., gates of a pair of transistors, such as n-channel transistors (e.g., NMOS transistors) 627-1 and 627-2 are cross coupled with the gates of another pair of transistors, such as p-channel transistors (e.g., PMOS transistors) 629-1 and 629-2). As described further herein, the latch 615 comprising transistors 627-1, 627-2, 629-1, and 629-2 can be referred to as a primary latch. However, embodiments are not limited to this example.

The voltages or currents on the respective data lines D and D_ can be provided to the respective latch inputs 633-1 and 633-2 of the cross coupled latch 615 (e.g., the input of the secondary latch). In this example, the latch input 633-1 is coupled to a first source/drain region of transistors 627-1 and 629-1 as well as to the gates of transistors 627-2 and 629-2. Similarly, the latch input 633-2 can be coupled to a first source/drain region of transistors 627-2 and 629-2 as well as to the gates of transistors 627-1 and 629-1. The compute component 633 (e.g., serving as an accumulator) can be coupled to latch inputs 633-1 and 633-2 of the cross coupled latch 615 as shown; however, embodiments are not limited to the example shown in FIG. 6.

In this example, a second source/drain region of transistor 627-1 and 627-2 is commonly coupled to an active negative control signal 628 (RnIF) A second source/drain region of transistors 629-1 and 629-2 is commonly coupled to an active positive control signal 690 (ACT). The ACT signal 690 can be a supply voltage (e.g., $V_{DD}$) and the RnIF signal can be a reference voltage (e.g., ground). Activating signals 628 and 690 enables the cross coupled latch 615.

The enabled cross coupled latch 615 operates to amplify a differential voltage between latch input 633-1 (e.g., first common node) and latch input 633-2 (e.g., second common node) such that latch input 633-1 is driven to one of the ACT signal voltage and the RnIF signal voltage (e.g., to one of $V_{DD}$ and ground), and latch input 633-2 is driven to the other of the ACT signal voltage and the RnIF signal voltage.

The sense amplifier 606 can also include circuitry configured to equilibrate the data lines D and D_ (e.g., in association with preparing the sense amplifier for a sensing operation). In this example, the equilibration circuitry comprises a transistor 624 having a first source/drain region coupled to a first source/drain region of transistor 625-1 and data line D 605-1. A second source/drain region of transistor 624 can be coupled to a first source/drain region of transistor 625-2 and data line D_ 605-2. A gate of transistor 624 can be coupled to gates of transistors 625-1 and 625-2.

The second source drain regions of transistors 625-1 and 625-2 are coupled to an equilibration voltage 638 (e.g., $V_{DD}/2$), which can be equal to $V_{DD}/2$, where $V_{DD}$ is a supply voltage associated with the array. The gates of transistors 624, 625-1, and 625-2 can be coupled to control signal 625 (EQ). As such, activating EQ enables the transistors 624, 625-1, and 625-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., serving as an accumulator).

As shown in FIG. 5, the sense amplifier 506 and the compute component 531 can be coupled to the array 530 via shift circuitry 523. In this example, the shift circuitry 523 comprises a pair of isolation devices (e.g., isolation transistors 521-1 and 521-2) coupled to data lines 505-1 (D) and 505-2 (D_), respectively). The isolation transistors 521-1 and 521-2 are coupled to a control signal 522 (NORM) that, when activated, enables (e.g., turns on) the isolation transistors 521-1 and 521-2 to couple the corresponding sense amplifier 506 and compute component 531 to a corresponding column of memory cells (e.g., to a corresponding pair of complementary data lines 505-1 (D) and 505-2 (D_)). According to various embodiments, conduction of isolation transistors 521-1 and 521-2 can be referred to as a "normal" configuration of the shift circuitry 523.

In the example illustrated in FIG. 5, the shift circuitry 523 includes another (e.g., a second) pair of isolation devices (e.g., isolation transistors 521-3 and 521-4) coupled to a complementary control signal 519 (SHIFT), which can be activated, for example, when NORM is deactivated. The isolation transistors 521-3 and 521-4 can be operated (e.g., via control signal 519) such that a particular sense amplifier 506 and compute component 531 are coupled to a different pair of complementary data lines (e.g., a pair of complementary data lines different than the pair of complementary data lines to which isolation transistors 521-1 and 521-2 couple the particular sense amplifier 506 and compute component 531), or can couple a particular sense amplifier 506 and compute component 531 to another memory array (and isolate the particular sense amplifier 506 and compute component 531 from a first memory array). According to various embodiments, the shift circuitry 523 can be arranged as a portion of (e.g., within) the sense amplifier 506, for instance.

Although the shift circuitry 523 shown in FIG. 5 includes isolation transistors 521-1 and 521-2 used to couple particular sensing circuitry 550 (e.g., a particular sense amplifier 506 and corresponding compute component 531) to a particular pair of complementary data lines 505-1 (D) and 505-2 (D_) (e.g., DIGIT(n) and DIGIT(n)_) and isolation transistors 521-3 and 521-4 are arranged to couple the particular sensing circuitry 550 to an adjacent pair of complementary data lines in one particular direction (e.g., adjacent data lines DIGIT(n+1) and DIGIT(n+1)_ shown to the right in FIG. 5), embodiments of the present disclosure are not so limited. For instance, shift circuitry can include isolation transistors 521-1 and 521-2 used to couple particular sensing circuitry to a particular pair of complementary data lines (e.g., DIGIT(n) and DIGIT(n)_ and isolation transistors 521-3 and 521-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 5).

Embodiments of the present disclosure are not limited to the configuration of shift circuitry 523 shown in FIG. 5. In a number of embodiments, shift circuitry 523 such as that shown in FIG. 5 can be operated (e.g., in conjunction with sense amplifiers 506 and compute components 531) in association with performing compute functions such as adding and subtracting functions without transferring data out of the sensing circuitry 550 via an I/O line (e.g., local I/O line (IO/IO_)), for instance.

Although not shown in FIG. 5, each column of memory cells can be coupled to a column decode line that can be enabled to transfer, via local I/O line, a data value from a corresponding sense amplifier 506 and/or compute component 531 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 523 can be operated in conjunction with sense amplifiers 506 and compute components 531 to perform compute functions such as adding and subtracting functions without transferring data to a control component external to the array, for instance.

The sensing circuitry 550 can be operated in several modes to perform logical operations, including a first mode in which a result of the logical operation is initially stored in the compute component 531, and a second mode in which a result of the logical operation is initially stored in the sense amplifier 506. Operation of the sensing circuitry 550 in the first mode is described in association with the timing diagrams shown in FIGS. 9-12. Operation of the sensing circuitry 550 in the second mode is described below with respect to FIGS. 7 and 8. Additionally, with respect to the second operating mode, sensing circuitry 550 can be operated in both pre-sensing (e.g., sense amps fired before logical operation control signal active) and post-sensing (e.g., sense amps fired after logical operation control signal active) modes with a result of a logical operation being initially stored in the sense amplifier 506.

As described further below, the sense amplifier 506 can, in conjunction with the compute component 531, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 550 of FIG. 5 is described below and summarized in Table 2 below with respect to performing logical operations and initially storing a result in the sense amplifier 506. Initially storing the result of a particular logical operation in the primary latch of sense amplifier 506 can provide improved versatility as compared to previous approaches in which the result may initially reside in a secondary latch (e.g., serving as an accumulator) of a compute component 531, and then be subsequently transferred to the sense amplifier 506, for instance.

TABLE 2

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 506 (e.g., without having to perform an additional operation to move the result from the compute component 531 (e.g., serving as an accumulator) to the sense amplifier 506) is advantageous because, for instance, the result can be written to a row (of the array of memory cells) or back into the accumulator without performing a precharge cycle (e.g., on the complementary data lines 505-1 (D) and/or 505-2 (D_)).

Figure 7:
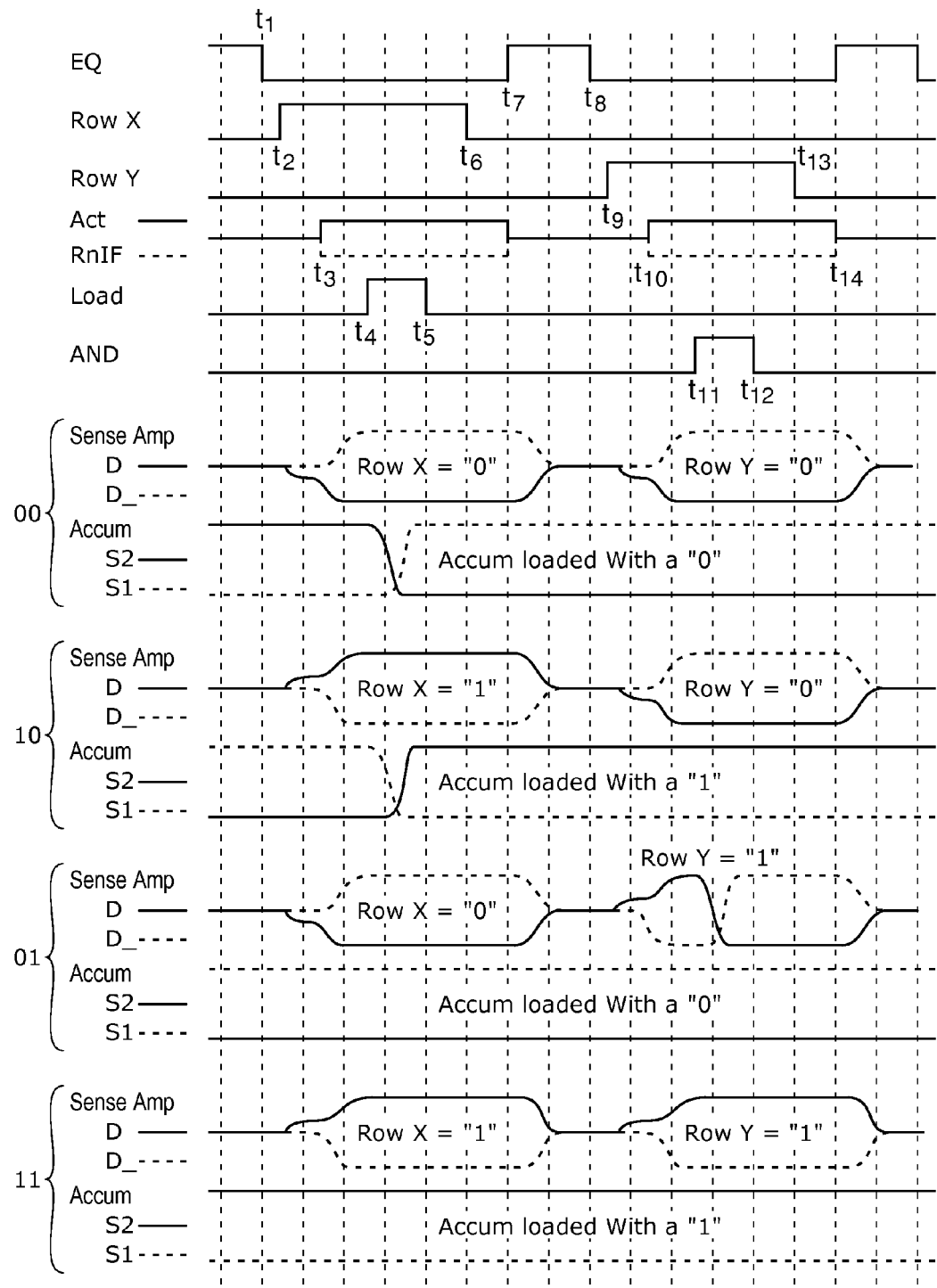
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure.

The sensing circuitry 550 can be operated in several modes to perform logical operations, including a second mode in which a result of the logical operation is initially stored in the sense amplifier 506, and a first mode in which a result of the logical operation is initially stored in the compute component 531. Operation of the sensing circuitry 550 in the second mode is described below with respect to FIGS. 7 and 8, and operation of the sensing circuitry 550 in the first mode is described below with respect to FIGS. 9-12. Additionally, with respect to the second operating mode, sensing circuitry 550 can be operated in both pre-sensing (e.g., sense amps fired before logical operation control signal active) and post-sensing (e.g., sense amps fired after logical operation control signal active) modes with a result of a logical operation being initially stored in the sense amplifier 506.

FIG. 7 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 7 illustrates a number of control signals associated with operating sensing circuitry (e.g., 550) to perform the AND logical operation. "EQ" corresponds to an equilibrate signal applied to the sense amplifier 506, "ROW X" corresponds to an enabling signal applied to access line 504-X, "ROW Y" corresponds to an enabling signal applied to access line 504-Y, "Act" and "RnIF" correspond to a respective active positive and negative control signal applied to the sense amplifier 506, "LOAD" corresponds to a load control signal (e.g., LOAD/PASSD and LOAD/PASSDb shown in FIG. 5), and "AND" corresponds to the AND control signal shown in FIG. 5. FIG. 7 also illustrates the waveform diagrams showing the signals (e.g., voltage signals) on the digit lines D and D_ corresponding to sense amplifier 506 and on the nodes S1 and S2 corresponding to the compute component 531 (e.g., serving as an accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 5.

An example of pseudo code associated with loading (e.g., copying) a first data value stored in a cell coupled to row 504-X into the accumulator can be summarized as follows:

Copy Row X into the Accumulator:
  Deactivate EQ;
  Open Row X;
  Fire Sense Amps (after which Row X data resides in the sense amps);
  Activate LOAD (sense amplifier data (Row X) is transferred to nodes
    S1 and S2 of the Accumulator and resides there dynamically);
  Deactivate LOAD;
  Close Row X;
  Precharge;

In the pseudo code above, "Deactivate EQ" indicates that an equilibration signal (EQ signal shown in FIG. 7) corresponding to the sense amplifier 506 is disabled at $t_1$ as shown in FIG. 7 (e.g., such that the complementary data lines (e.g., 505-1 (D) and 505-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 7. When the voltage signal applied to ROW X reaches the threshold voltage (Vt) of the access transistor (e.g., 502-2) corresponding to the selected cell, the access transistor turns on and couples the data line (e.g., 505-2 (D_)) to the selected cell (e.g., to capacitor 503-2) which creates a differential voltage signal between the data lines.

After Row X is enabled in the pseudo code above, "Fire Sense Amps" indicates that the sense amplifier 506 is enabled to set the primary latch and subsequently disabled. For example, as shown at $t_3$ in FIG. 7, the ACT positive control signal (e.g., 690 shown in FIG. 6) goes high and the RnIF negative control signal (e.g., 628 shown in FIG. 6) goes low, which amplifies the differential signal between 505-1 (D) and D_ 505-2, resulting in a voltage (e.g., $V_{DD}$) corresponding to a logic 1 or a voltage (e.g., GND) corresponding to a logic 0 being on data line 505-1 (D) (and the voltage corresponding to the other logic state being on complementary data line 505-2 (D_)). The sensed data value is stored in the primary latch of sense amplifier 506. The primary energy consumption occurs in charging the data lines (e.g., 505-1 (D) or 505-2 (D_)) from the equilibration voltage $V_{DD}/2$ to the rail voltage $V_{DD}$.

The four sets of possible sense amplifier and accumulator signals illustrated in FIG. 7 (e.g., one for each combination of Row X and Row Y data values) shows the behavior of signals on data lines D and D_. The Row X data value is stored in the primary latch of the sense amp. It should be noted that FIG. 5 shows that the memory cell including storage element 503-2 and access transistor 502-2, corresponding to Row X, is coupled to the complementary data line D_, while the memory cell including storage element 503-1 and access transistor 502-1, corresponding to Row Y, is coupled to data line D. However, as can be seen in FIG. 5, the charge stored in the memory cell comprising access transistor 502-2 (corresponding to Row X) corresponding to a "0" data value causes the voltage on data line D_ (to which access transistor 502-2 is coupled) to go high and the charge stored in the memory cell comprising access transistor 502-2 corresponding to a "1" data value causes the voltage on data line D_ to go low, which is opposite correspondence between data states and charge stored in the memory cell comprising access transistor 502-1, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 7, causing load/pass transistors 518-1 and 518-2 to conduct. In this manner, activating the LOAD control signal enables the secondary latch in the accumulator of the compute component 531. The sensed data value stored in the sense amplifier 506 is transferred (e.g., copied) to the secondary latch. As shown for each of the four sets of possible sense amplifier and accumulator signals illustrated in FIG. 7, the behavior at inputs of the secondary latch of the accumulator indicates the secondary latch is loaded with the Row X data value. As shown in FIG. 7, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 505-1 (D) and 505-2 (D_), in the pseudo code above, "Deactivate LOAD" indicates that the LOAD control signal goes back low as shown at $t_5$ in FIG. 7 to cause the load/pass transistors 518-1 and 518-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 7, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 7 by the EQ signal going high at $t_7$. As shown in each of the four sets of possible sense amplifier and accumulator signals illustrated in FIG. 7 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 506 and the secondary latch of the compute component 531) and the second data value (stored in a memory cell 502-1 coupled to Row Y 504-Y) includes performing particular steps which depend on the whether an AND or an OR is to be performed. Examples of pseudo code associated with "ANDing" and "ORing" the data value residing in the accumulator (e.g., the first data value stored in the memory cell 502-2 coupled to Row X 504-X) and the second data value (e.g., the data value stored in the memory cell 502-1 coupled to Row Y 504-Y) are summarized below. Example pseudo code associated with "ANDing" the data values can include:

Deactivate EQ;
Open Row Y;
Fire Sense Amps (after which Row Y data resides in the sense amps);
Close Row Y;
  The result of the logic operation, in the next operation, will be placed on the sense amp, which will overwrite any row that is active;
  Even when Row Y is closed, the sense amplifier still contains the Row Y data value;
Activate AND;
  This results in the sense amplifier being written to the value of the function (e.g., Row X AND Row Y);
  If the accumulator contains a "0" (i.e., a voltage corresponding to a "0" on node S2 and a voltage corresponding to a "1" on node S1), the sense amplifier data is written to a "0";
  If the accumulator contains a "1" (i.e., a voltage corresponding to a "1" on node S2 and a voltage corresponding to a "0" on node S1), the sense amplifier data remains unchanged (Row Y data);
  This operation leaves the data in the accumulator unchanged;
Deactivate AND;
Precharge;

In the pseudo code above, "Deactivate EQ" indicates that an equilibration signal corresponding to the sense amplifier 506 is disabled (e.g., such that the complementary data lines 505-1 (D) and 505-2 (D_) are no longer shorted to $V_{DD}/2$), which is illustrated in FIG. 7 at $t_8$. After equilibration is disabled, a selected row (e.g., ROW Y) is enabled as indicated in the pseudo code above by "Open Row Y" and shown in FIG. 7 at $t_9$. When the voltage signal applied to ROW Y reaches the threshold voltage (Vt) of the access transistor (e.g., 502-1) corresponding to the selected cell, the access transistor turns on and couples the data line (e.g., D_ 505-1) to the selected cell (e.g., to capacitor 503-1) which creates a differential voltage signal between the data lines.

After Row Y is enabled, in the pseudo code above, "Fire Sense Amps" indicates that the sense amplifier 506 is enabled to amplify the differential signal between 505-1 (D) and 505-2 (D_), resulting in a voltage (e.g., $V_{DD}$) corresponding to a logic 1 or a voltage (e.g., GND) corresponding to a logic 0 being on data line 505-1 (D) (and the voltage corresponding to the other logic state being on complementary data line 505-2 (D_)). As shown at $t_{10}$ in FIG. 7, the ACT positive control signal (e.g., 690 shown in FIG. 6) goes high and the RnIF negative control signal (e.g., 628 shown in FIG. 6) goes low to fire the sense amps. The sensed data value from memory cell 502-1 is stored in the primary latch of sense amplifier 506, as previously described. The secondary latch still corresponds to the data value from memory cell 502-2 since the dynamic latch is unchanged.

After the second data value sensed from the memory cell 502-1 coupled to Row Y is stored in the primary latch of sense amplifier 506, in the pseudo code above, "Close Row Y" indicates that the selected row (e.g., ROW Y) can be disabled if it is not desired to store the result of the AND logical operation back in the memory cell corresponding to Row Y. However, FIG. 7 shows that Row Y is left enabled such that the result of the logical operation can be stored back in the memory cell corresponding to Row Y. Isolating the memory cell corresponding to Row Y can be accomplished by the access transistor turning off to decouple the selected cell 502-1 from the data line 505-1 (D). After the selected Row Y is configured (e.g., to isolate the memory cell or not isolate the memory cell), "Activate AND" in the pseudo code above indicates that the AND control signal goes high as shown in FIG. 7 at $t_{11}$, causing pull down transistor 507-1 to conduct. In this manner, activating the AND control signal causes the value of the function (e.g., Row X AND Row Y) to be written to the sense amp.

With the first data value (e.g., Row X) stored in the dynamic latch of the accumulator 531 and the second data value (e.g., Row Y) stored in the sense amplifier 506, if the dynamic latch of the compute component 531 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 509-1 to conduct thereby coupling the sense amplifier 506 to ground through transistor 509-1, pull down transistor 507-1 and data line 505-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 506. This operation leaves the data value in the accumulator unchanged (e.g., from Row X).

If the secondary latch of the accumulator contains a "1" (e.g., from Row X), then the result of the AND operation depends on the data value stored in the sense amplifier 506 (e.g., from Row Y). The result of the AND operation should be a "1" if the data value stored in the sense amplifier 506 (e.g., from Row Y) is also a "1," but the result of the AND operation should be a "0" if the data value stored in the sense amplifier 506 (e.g., from Row Y) is also a "0." The sensing circuitry 550 is configured such that if the dynamic latch of the accumulator contains a "1" (i.e., a voltage corresponding to a "1" on node S2 and a voltage corresponding to a "0" on node S1), transistor 509-1 does not conduct, the sense amplifier is not coupled to ground (as described above), and the data value previously stored in the sense amplifier 506 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 506, "Deactivate AND" in the pseudo code above indicates that the AND control signal goes low as shown at $t_{12}$ in FIG. 7, causing pull down transistor 507-1 to stop conducting to isolate the sense amplifier 506 (and data line 505-1 (D)) from ground. If not previously done, Row Y can be closed (as shown at $t_{13}$ in FIG. 7) and the sense amplifier can be disabled (as shown at $t_{14}$ in FIG. 7 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 7).

FIG. 7 shows, in the alternative, the behavior of voltage signals on the data lines (e.g., 505-1 (D) and 505-2 (D_) shown in FIG. 5) coupled to the sense amplifier (e.g., 506 shown in FIG. 5) and the behavior of voltage signals on nodes S1 and S1 of the secondary latch of the compute component (e.g., 531 shown in FIG. 5) for an AND logical operation involving each of the possible combination of operands (e.g., Row X/Row Y data values 00, 10, 01, and 11).

Although the timing diagrams illustrated in FIG. 7 and the pseudo code described above indicate initiating the AND logical operation after starting to load the second operand (e.g., Row Y data value) into the sense amplifier, the circuit shown in FIG. 5 can be successfully operated by initiating the AND logical operation before starting to load the second operand (e.g., Row Y data value) into the sense amplifier.

Figure 8:
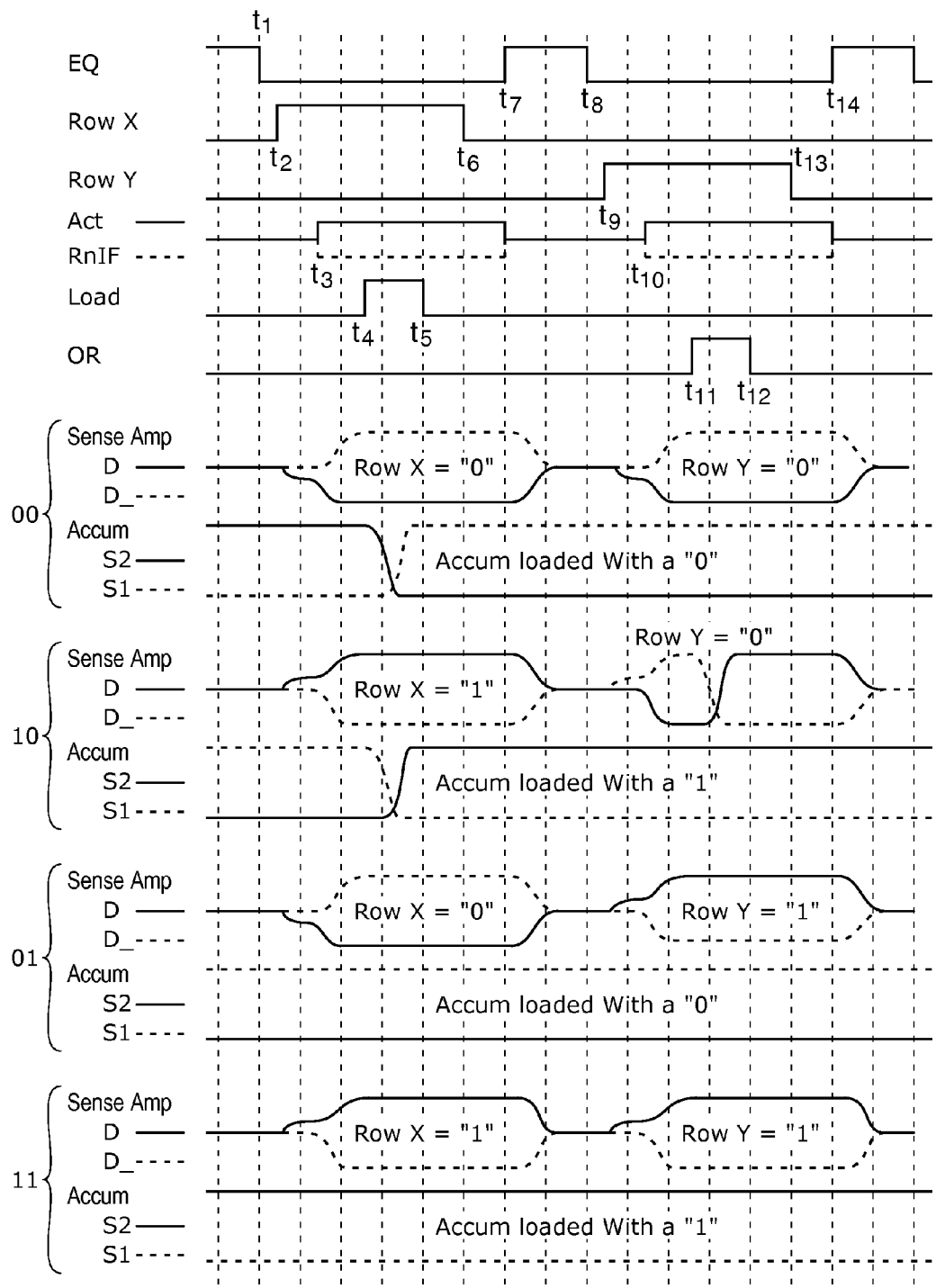
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an OR logical operation after starting to load the second operand (e.g., Row Y data value) into the sense amplifier. FIG. 8 illustrates the sense amplifier and accumulator signals for various combinations of first and second operand data values. The particular timing diagram signals are discussed below with respect to the pseudo code associated with an AND logical operation of the circuit shown in FIG. 5.

A subsequent operation phase can alternately be associated with performing the OR operation on the first data value (now stored in the sense amplifier 506 and the secondary latch of the compute component 531) and the second data value (stored in a memory cell 502-1 coupled to Row Y 504-Y). The operations to load the Row X data into the sense amplifier and accumulator that were previously described with respect to times $t_1$-$t_7$ shown in FIG. 7 are not repeated with respect to FIG. 8. Example pseudo code associated with "ORing" the data values can include:

Deactivate EQ;
Open Row Y;
Fire Sense Amps (after which Row Y data resides in the sense amps);
Close Row Y;
   When Row Y is closed, the sense amplifier still contains the Row Y data value;
Activate OR;
   This results in the sense amplifier being written to the value of the function (e.g., Row X OR Row Y), which may overwrite the data value from Row Y previously stored in the sense amplifier as follows:
   If the accumulator contains a "0" (i.e., a voltage corresponding to a "0" on node S2 and a voltage corresponding to a "1" on node S1), the sense amplifier data remains unchanged (Row Y data);
   If the accumulator contains a "1" (i.e., a voltage corresponding to a "1" on node S2 and a voltage corresponding to a "0" on node S1), the sense amplifier data is written to a "1";
   This operation leaves the data in the accumulator unchanged;
Deactivate OR;
Precharge;

The "Deactivate EQ" (shown at $t_8$ in FIG. 8), "Open Row Y" (shown at $t_9$ in FIG. 8), "Fire Sense Amps" (shown at $t_{10}$ in FIG. 8), and "Close Row Y" (shown at $t_{13}$ in FIG. 8, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 8, which causes pull down transistor 507-2 to conduct. In this manner, activating the OR control signal causes the value of the function (e.g., Row X OR Row Y) to be written to the sense amp.

With the first data value (e.g., Row X) stored in the secondary latch of the compute component 531 and the second data value (e.g., Row Y) stored in the sense amplifier 506, if the dynamic latch of the accumulator contains a "0" (i.e., a voltage corresponding to a "0" on node S2 and a voltage corresponding to a "1" on node S1), then the result of the OR operation depends on the data value stored in the sense amplifier 506 (e.g., from Row Y). The result of the OR operation should be a "1" if the data value stored in the sense amplifier 506 (e.g., from Row Y) is a "1," but the result of the OR operation should be a "0" if the data value stored in the sense amplifier 506 (e.g., from Row Y) is also a "0." The sensing circuitry 550 is configured such that if the dynamic latch of the accumulator contains a "0," with the voltage corresponding to a "0" on node S2, transistor 509-2 is off and does not conduct (and pull down transistor 507-1 is also off since the AND control signal is not asserted) so the sense amplifier 506 is not coupled to ground (either side), and the data value previously stored in the sense amplifier 506 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 509-2 does conduct (as does pull down transistor 507-2 since the OR control signal is asserted), and the sense amplifier 506 input coupled to data line 505-2 (D_) is coupled to ground since the voltage corresponding to a "1" on node S2 causes transistor 509-2 to conduct along with pull down transistor 507-2 (which also conducts since the OR control signal is asserted). In this manner, a "1" is initially stored in the sense amplifier 506 as a result of the OR operation when the secondary latch of the accumulator contains a "1" regardless of the data value previously stored in the sense amp. This operation leaves the data in the accumulator unchanged. FIG. 8 shows, in the alternative, the behavior of voltage signals on the data lines (e.g., 505-1 (D) and 505-2 (D_)) shown in FIG. 5) coupled to the sense amplifier (e.g., 506 shown in FIG. 5) and the behavior of voltage signals on nodes S1 and S2 of the secondary latch of the compute component 531 for an OR logical operation involving each of the possible combination of operands (e.g., Row X/Row Y data values 00, 10, 01, and 11).

After the result of the OR operation is initially stored in the sense amplifier 506, "Deactivate OR" in the pseudo code above indicates that the OR control signal goes low as shown at $t_{12}$ in FIG. 8, causing pull down transistor 507-2 to stop conducting to isolate the sense amplifier 506 (and data line D 505-2) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 8.

The sensing circuitry 550 illustrated in FIG. 5 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 514-1 to conduct and activating the ANDinv control signal causes transistor 514-2 to conduct. In each case, asserting the appropriate inverted control signal can flip the sense amplifier and cause the result initially stored in the sense amplifier 506 to be that of the AND operation using inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 5 can perform a NOT (e.g., invert) operation by putting the non-inverted data value into the dynamic latch of the accumulator and using that data to invert the data value in the sense amplifier 506. As previously mentioned, activating the ORinv control signal causes transistor 514-1 to conduct and activating the ANDinv control signal causes transistor 514-2 to conduct. The ORinv and/or ANDinv control signals are used in implementing the NOT function, as described further below:

---

Copy Row X into the Accumulator
  Deactivate EQ
  Open Row X
  Fire Sense Amps (after which Row X data resides in the sense amps)
  Activate LOAD (sense amplifier data (Row X) is transferred to nodes
    S1 and S2 of the Accumulator and resides there dynamically
  Deactivate LOAD
  Activate ANDinv and ORinv (which puts the compliment data value
    on the data lines)
    This results in the data value in the sense amplifier being inverted
      (e.g., the sense amplifier latch is flipped)
    This operation leaves the data in the accumulator unchanged
  Deactivate ANDinv and ORinv
  Close Row X
  Precharge

---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and precharging after the Row X data is loaded into the sense amplifier 506 and copied into the dynamic latch, a complement version of the data value in the dynamic latch of the accumulator can be placed on the data line and thus transferred to the sense amplifier 506 by enabling (e.g., causing transistor to conduct) and disabling the invert transistors (e.g., ANDinv and ORinv). This results in the sense amplifier 506 being flipped from the true data value that was previously stored in the sense amplifier to a complement data value (e.g., inverted data value) stored in the sense amp. That is, a true or complement version of the data value in the accumulator can be transferred to the sense amplifier by activating and deactivating ANDinv and ORinv. This operation leaves the data in the accumulator unchanged.

Because the sensing circuitry 550 shown in FIG. 5 initially stores the result of the AND, OR, and NOT logical operations in the sense amplifier 506 (e.g., on the sense amplifier nodes), these logical operation results can be communicated easily and quickly to any enabled row and/or into the secondary latch of the compute component 531. The sense amplifier 506 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 506 fires.

When performing logical operations in this manner, the sense amplifier 506 can be pre-seeded with a data value from the dynamic latch of the accumulator to reduce overall current utilized because the sense amps 506 are not at full rail voltages (e.g., supply voltage or ground/reference voltage) when accumulator function is copied to the sense amplifier 506. An operation sequence with a pre-seeded sense amplifier 506 either forces one of the data lines to the reference voltage (leaving the complementary data line at $V_{DD}/2$, or leaves the complementary data lines unchanged. The sense amplifier 506 pulls the respective data lines to full rails when the sense amplifier 506 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 523 can be used for shifting data values stored in memory cells coupled to a particular pair of complementary data lines to the sensing circuitry 550 (e.g., sense amplifier 506) corresponding to a different pair of complementary data lines (e.g., such as a sense amplifier 506 corresponding to a left or right adjacent pair of complementary data lines. As used herein, a sense amplifier 506 corresponds to the pair of complementary data lines to which the sense amplifier is coupled when isolation transistors 521-1 and 521-2 are conducting. The SHIFT operations (right or left) do not pre-copy the Row X data value into the accumulator. Operations to shift right Row X can be summarized as follows:

---

Deactivate Norm and Activate Shift
Deactivate EQ
Open Row X
Fire Sense Amps (after which shifted Row X data resides in the sense amps)
Activate Norm and Deactivate Shift
Close Row X
Precharge

---

In the pseudo code above, "Deactivate Norm and Activate Shift" indicates that a NORM control signal goes low causing isolation transistors 521-1 and 521-2 of the shift circuitry 523 to not conduct (e.g., isolate the sense amplifier from the corresponding pair of complementary data lines). The SHIFT control signal goes high causing isolation transistors 521-3 and 521-4 to conduct, thereby coupling the sense amplifier 506 to the left adjacent pair of complementary data lines (e.g., on the memory array side of non-conducting isolation transistors 521-1 and 521-2 for the left adjacent pair of complementary data lines).

After the shift circuitry 523 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 506.

In the pseudo code above, "Activate Norm and Deactivate Shift" indicates that a NORM control signal goes high causing isolation transistors 521-1 and 521-2 of the shift circuitry 523 to conduct (e.g., coupling the sense amplifier to the corresponding pair of complementary data lines), and the SHIFT control signal goes low causing isolation transistors 521-3 and 521-4 to not conduct and isolating the sense amplifier 506 from the left adjacent pair of complementary data lines (e.g., on the memory array side of non-conducting isolation transistors 521-1 and 521-2 for the left adjacent pair of complementary data lines). Since Row X is still active, the Row X data value that has been shifted right is transferred to Row X of the corresponding pair of complementary data lines through isolation transistors 521-1 and 521-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift;
Deactivate EQ;
Open Row X;
Fire Sense Amps (after which Row X data resides in the sense amps);
Deactivate Norm and Activate Shift;
   Sense amplifier data (shifted left Row X) is transferred to Row X;
Close Row X;
Precharge;

---

In the pseudo code above, "Activate Norm and Deactivate Shift" indicates that a NORM control signal goes high causing isolation transistors 521-1 and 521-2 of the shift circuitry 523 to conduct, and the SHIFT control signal goes low causing isolation transistors 521-3 and 521-4 to not conduct. This configuration couples the sense amplifier 506 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 550 is stored in the sense amplifier 506.

In the pseudo code above, "Deactivate Norm and Activate Shift" indicates that a NORM control signal goes low causing isolation transistors 521-1 and 521-2 of the shift circuitry 523 to not conduct (e.g., isolate the sense amplifier from the corresponding pair of complementary data lines), and the SHIFT control signal goes high causing isolation transistors 521-3 and 521-4 to conduct coupling the sense amplifier to the left adjacent pair of complementary data lines (e.g., on the memory array side of non-conducting isolation transistors 521-1 and 521-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. A potential advantage of certain example apparatuses and methods described herein can be the cumulative speed that can be achieved by an entire bank of data being computed in parallel without necessarily transferring data out of the memory array (e.g., DRAM) or firing a column decode. For example, data transfer time can be reduced and/or eliminated. For example, apparatuses of the present disclosure can perform ANDs or ORs simultaneously using data values in memory cells coupled to a data line (e.g., a column of 6K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 9:
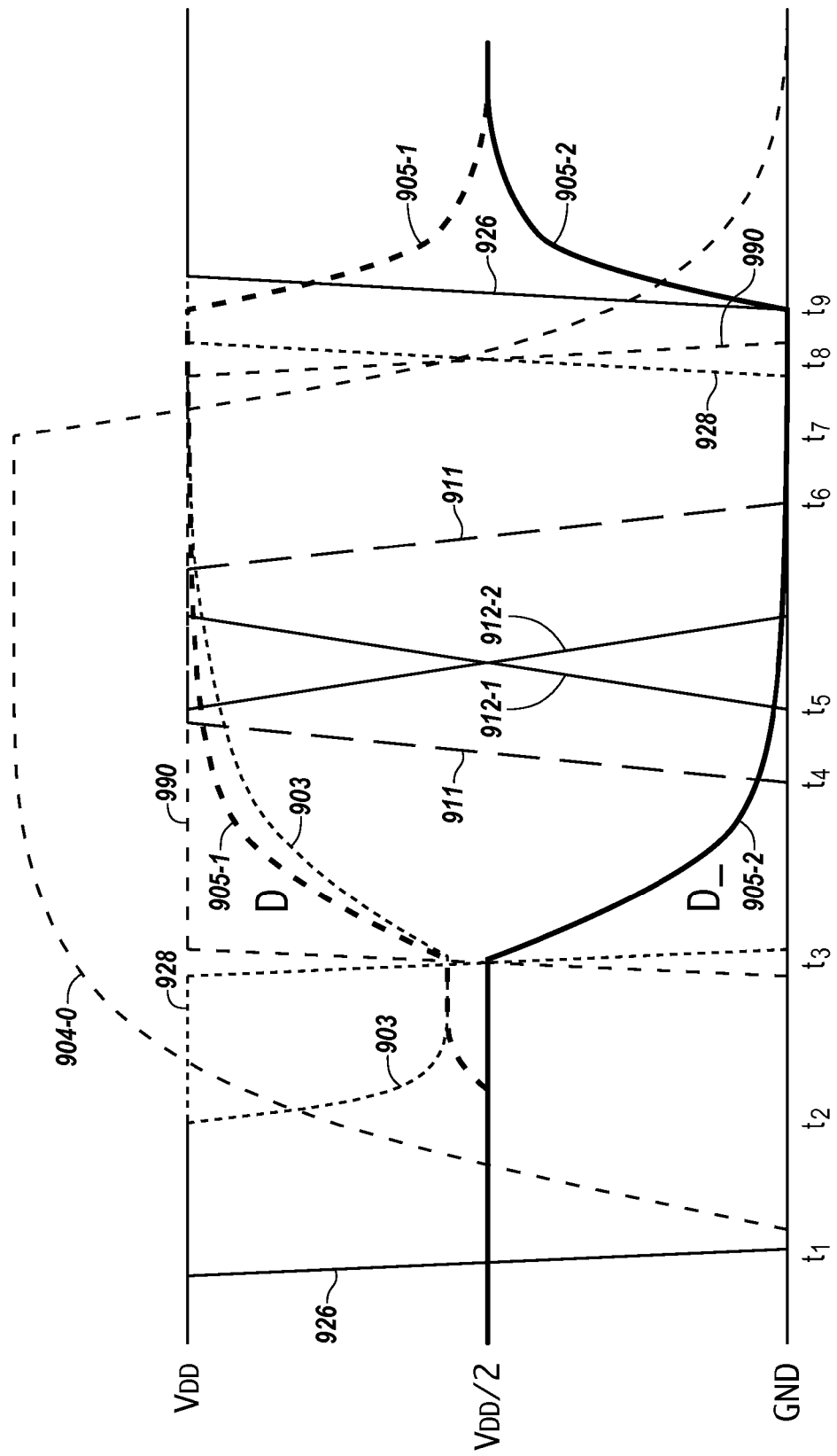
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry 550 shown in FIG. 5 in accordance with a number of embodiments of the present disclosure. The timing diagram shown in FIG. 9 illustrates signals (e.g., voltage signals) associated with performing a first operation phase of a logical operation (e.g., an R-input logical operation). The first operation phase described with respect to FIG. 9 can be a first operation phase of an AND, NAND, OR, or NOR operation, for instance. Performing the operation phase illustrated in FIG. 9 can involve consuming significantly less energy (e.g., about half) than previous processing approaches that may involve providing a full swing between voltage rails (e.g., between a supply and ground).

In the example illustrated in FIG. 9, the voltage rails corresponding to complementary logic values (e.g., "1" and "0") are a supply voltage ($V_{CC}$) and a reference voltage (e.g., ground (Gnd)). Prior to performing a logical operation, an equilibration can occur such that the complementary data lines D and D_ are shorted together at an equilibration voltage ($V_{CC}/2$), as previously described.

The first operation phase of a logical operation described below involves loading a first operand of the logical operation into the accumulator. The time references (e.g., $t_1$, etc.) shown in FIG. 9 do not necessarily represent a same absolute or relative time as similar time references in other timing diagrams. At time $t_1$, the equilibration signal 926 is deactivated, and then a selected row is enabled (e.g., the row corresponding to a memory cell whose data value is to be sensed and used as a first input). Signal 904-0 represents the voltage signal applied to the selected row of memory cells. When row signal 904-0 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines (e.g., 505-1 (D) and 505-2 (D_) shown in FIG. 5) (e.g., as indicated by signals 905-1 and 905-2 on the data lines, respectively) between times $t_2$ and $t_3$. The voltage of the selected cell is represented by signal 903. Due to conservation of energy, creating the differential signal between data lines 505-1 (D) and 505-2 (D_) (e.g., by coupling the cell to data line D) does not consume energy, since the energy associated with enabling/disabling the row signal 904-0 can be amortized over the plurality of memory cells coupled to the row.

At time $t_3$, the sense amplifier (e.g., 506 shown in FIG. 5) is enabled by control signal 990 (e.g., ACT shown in FIG. 6) goes high and the negative control signal 928 (e.g., RnIF shown in FIG. 5) goes low, which amplifies the differential signal between data lines 505-1 (D) and 505-2 (D_), resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 506. The primary energy consumption occurs in charging the data line 505-1 (D) from the equilibration voltage $V_{CC}/2$ to the rail voltage $V_{CC}$.

According to some embodiments, the primary latch of sense amplifier 506 can be coupled to the complementary data lines D and D_ through respective sense amplifier pass transistors (e.g., a second set of pass transistors between the sense amplifier 506 and the complementary data lines D and D_). Sense amplifier pass transistors, through which one node (e.g., S1) of the primary latch of sense amplifier 506 is coupled to the data line D can be controlled by a PASSD control signal 911 and the sense amplifier pass transistor through which another node (e.g., S2) of the primary latch of sense amplifier 506 is coupled to the data line D_ can be controlled by a PASSDB control signal, which can behave here the same as the PASSD control signal.

At time $t_4$, the sense amplifier pass transistors can be enabled (e.g., via respective PASSD and PASSDB control signals applied to control lines coupled to the respective gates of the sense amplifier pass transistors. At time $t_5$, accumulator control signals 912-1 (e.g., ACCUM) and 912-2 (e.g., ACCUMB) are activated via respective control lines 512-1 and 512-2 (e.g., where the accumulator is not constantly enabled by coupling control line 512-1 to GND and coupling control line 512-2 to $V_{DD}$). As described below, the accumulator control signals 912-1 and 912-2 may remain activated for subsequent operation phases. As such, in this example, activating the ACCUMB and ACCUM control signals 912-1 and 912-2 enables the secondary latch (e.g., serving as an accumulator) of compute component 531. The sensed data value stored in sense amplifier 506 is transferred (e.g., copied) to the secondary latch 564.

At time $t_6$, the sense amplifier pass transistors are disabled (e.g., turned off) by the PASSD and PASSDB control signals 911 going low. However, since the accumulator control signals 912-1 and 912-2 remain activated, an accumulated result is stored (e.g., latched) in the secondary latch (e.g., serving as an accumulator). At time $t_7$, the row signal 904-0 is deactivated, and the array sense amplifiers are disabled at time $t_8$ (e.g., control signals 928 and 990 enabling the sense amplifier are deactivated).

At time $t_9$, the data lines D and D_ are equilibrated (e.g., equilibration signal 926 is activated), as illustrated by data line voltage signals 905-1 and 905-2 moving from their respective rail values to the equilibration voltage ($V_{CC}/2$). The equilibration consumes little energy due to the law of conservation of energy. As described previously in association with FIG. 5, equilibration can involve shorting the complementary data lines D and D_ together at an equilibration voltage, which is $V_{CC}/2$, in this example. Equilibration can occur, for instance, prior to a memory cell sensing operation.

Figure 10:
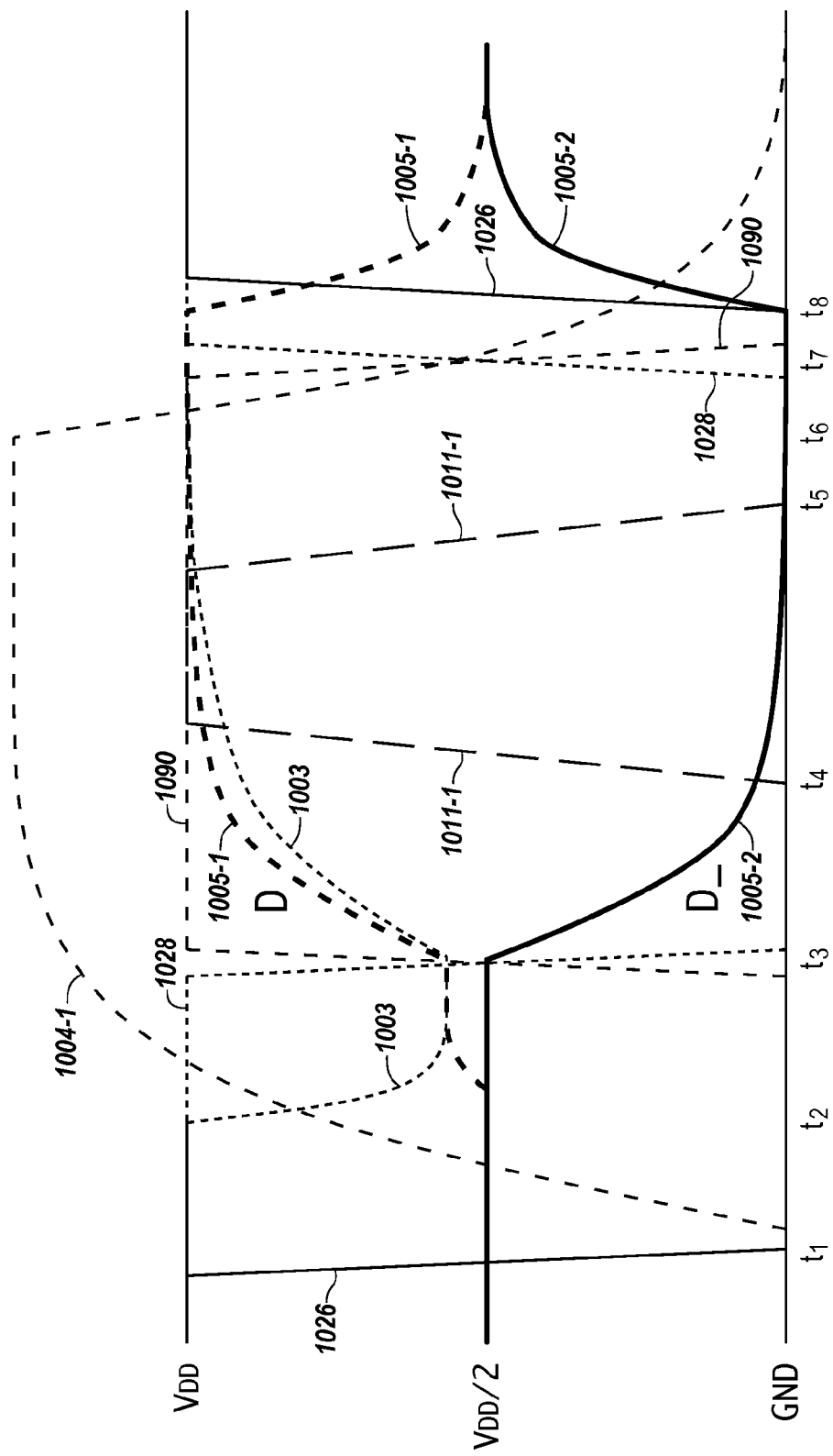
FIG. 10 illustrates a timing diagram associated with performing a number of logical operations using sensing circuitry in accordance with a number of embodiments of the present disclosure.
Figure 11:
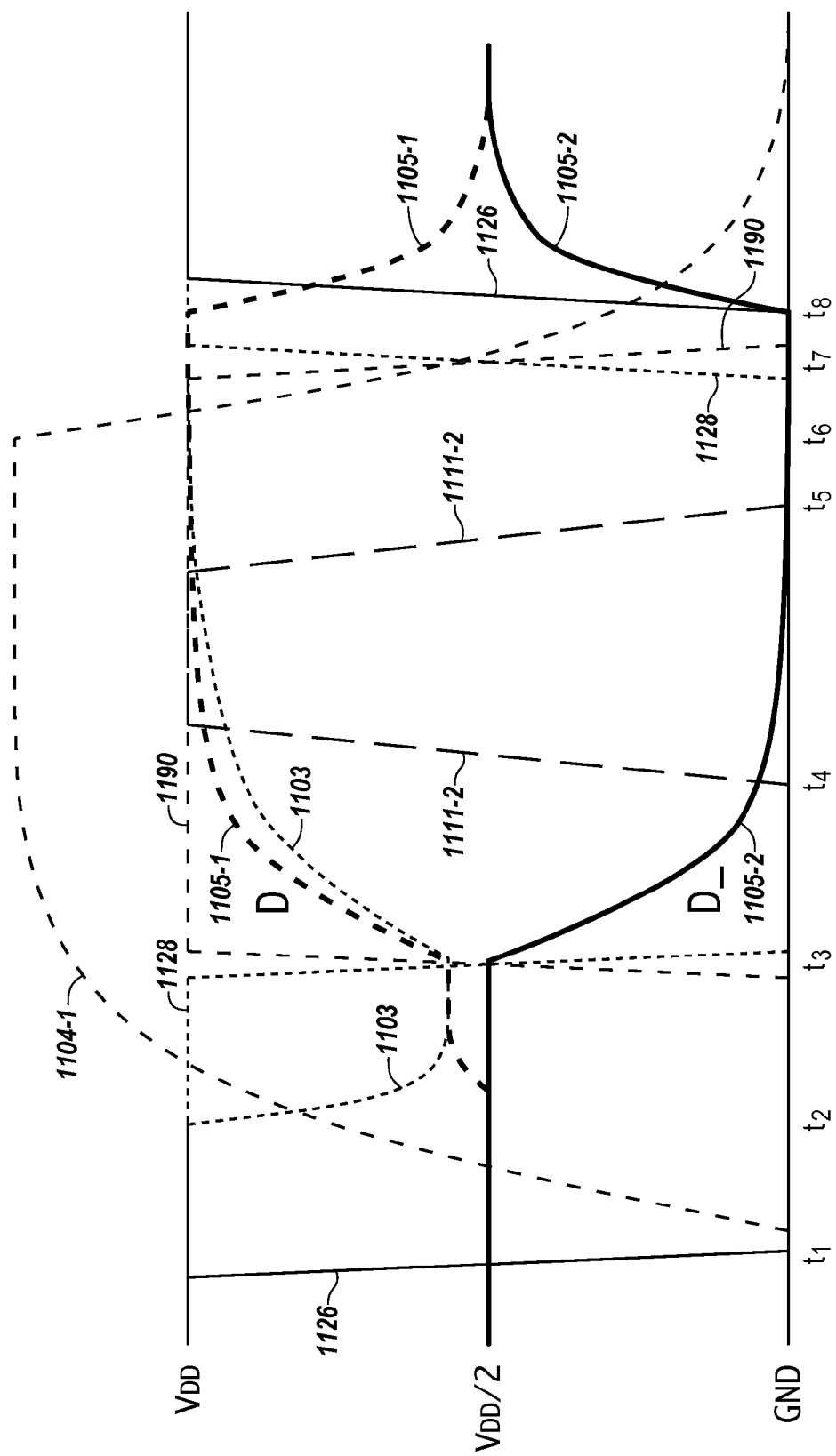
FIG. 11 illustrates a timing diagram associated with performing a number of logical operations using sensing circuitry in accordance with a number of embodiments of the present disclosure.

FIGS. 10 and 11 respectively illustrate timing diagrams associated with performing a number of logical operations using sensing circuitry in accordance with a number of embodiments of the present disclosure. Timing diagrams shown in FIGS. 10 and 11 illustrate signals (e.g., voltage signals) associated with performing a number of intermediate operation phases of a logical operation (e.g., an R-input logical operation). For example, performing an AND or NAND operation can include performing the operation phase shown in FIG. 10 one or more times subsequent to an initial operation phase such as that described with respect to FIG. 9. Similarly, performing an OR or NOR operation can include performing the operation phase shown and described with respect to FIG. 11 one or more times subsequent to an initial operation phase such as that described with respect to FIG. 9.

As shown in the timing diagrams illustrated in FIGS. 10 and 11, at time $t_1$, equilibration is disabled (e.g., the equilibration signal 1026/1126 is deactivated), and then a selected row is enabled (e.g., the row corresponding to a memory cell whose data value is to be sensed and used as an input such as a second input, third input, etc.). Signal 1004-1/1104-1 represents the voltage signal applied to the selected row. When row signal 1004-1/1104-1 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines D and D_ (e.g., as indicated by signals 1005-1/1105-1 and 1005-2/1105-2, respectively) between times $t_2$ and $t_3$. The voltage of the selected cell is represented by signal 1003/1103. Due to conservation of energy, creating the differential signal between D and D_ (e.g., by coupling the cell to data line D) does not consume energy, since the energy associated with activating/deactivating the row signal 1004-1/1104-1 can be amortized over the plurality of memory cells coupled to the row.

At time $t_3$, the sense amplifier (e.g., 506 shown in FIG. 5) is enabled (e.g., a positive control signal 1090/1190 (e.g., corresponding to ACT 690 shown in FIG. 6) goes high, and the negative control signal 1028/1128 (e.g., RnIF 628 shown in FIG. 6) goes low), which amplifies the differential signal between D and D_, resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 506. The primary energy consumption occurs in charging the data line D (505-1) from the equilibration voltage $V_{CC}/2$ to the rail voltage $V_{CC}$.

As shown in timing diagrams illustrated in FIGS. 10 and 11, at time $t_4$ (e.g., after the selected cell is sensed), only one of control signals 1011-1 (PASSD) shown in FIGS. 10 and 1111-2 (PASSDB) shown in FIG. 11 is activated (e.g., only one of pass transistors (if present) is enabled), depending on the particular logic operation. For example, since the timing diagram illustrated in FIG. 10 corresponds to an intermediate phase of a NAND or AND operation, control signal 1011-1 (PASSD) is activated at time t4 to turn on the pass transistor coupling the primary latch to data line D and the PASSDB control signal remains deactivated leaving the pass transistor coupling the primary latch to data line D_ turned off. Conversely, since the timing diagram illustrated in FIG. 11 corresponds to an intermediate phase of a NOR or OR operation, control signal 1111-2 (PASSDB) is activated at time t4 to turn on the pass transistor coupling the primary latch to data line D_ and control signal PASSD remains deactivated leaving the pass transistor coupling the primary latch to data line D turned off. Recall from above that the accumulator control signals 912-1 (Accumb) and 912-2 (Accum) were activated during the initial operation phase described with respect to FIG. 9, and they remain activated during the intermediate operation phase(s).

Since the accumulator was previously enabled, activating only PASSD (1011-1 as shown in FIG. 10) results in accumulating the data value corresponding to the voltage signal 1005-1 shown in FIG. 10 corresponding to data line D. Similarly, activating only PASSDB (1111-2 as shown in FIG. 11) results in accumulating the data value corresponding to the voltage signal 1105-2 corresponding to data line D_. For instance, in an example AND/NAND operation shown in the timing diagram illustrated in FIG. 4 in which only PASSD (1011-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 11 in which only PASSDB 1111-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1105-2 on D_ is setting the true data value of the accumulator.

At the conclusion of an intermediate operation phase such as that shown in FIG. 10 or 11, the PASSD signal 1011-1 (e.g., for AND/NAND) or the PASSDB signal 1111-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 10 or 11 can be repeated in order to accumulate results from a number of additional rows. As an example, the sequence of timing diagram illustrated in FIGS. 10 and/or 11 can be performed a subsequent (e.g., second) time for a third memory cell, a subsequent (e.g., third) time for a fourth memory cell, etc. For instance, for a 10-input NOR operation, the intermediate phase shown in FIG. 11 can occur 9 times to provide 9 inputs of the 10-input logical operation, with the tenth input being determined during the initial operation phase (e.g., as described with respect to FIG. 9).

Figure 12:
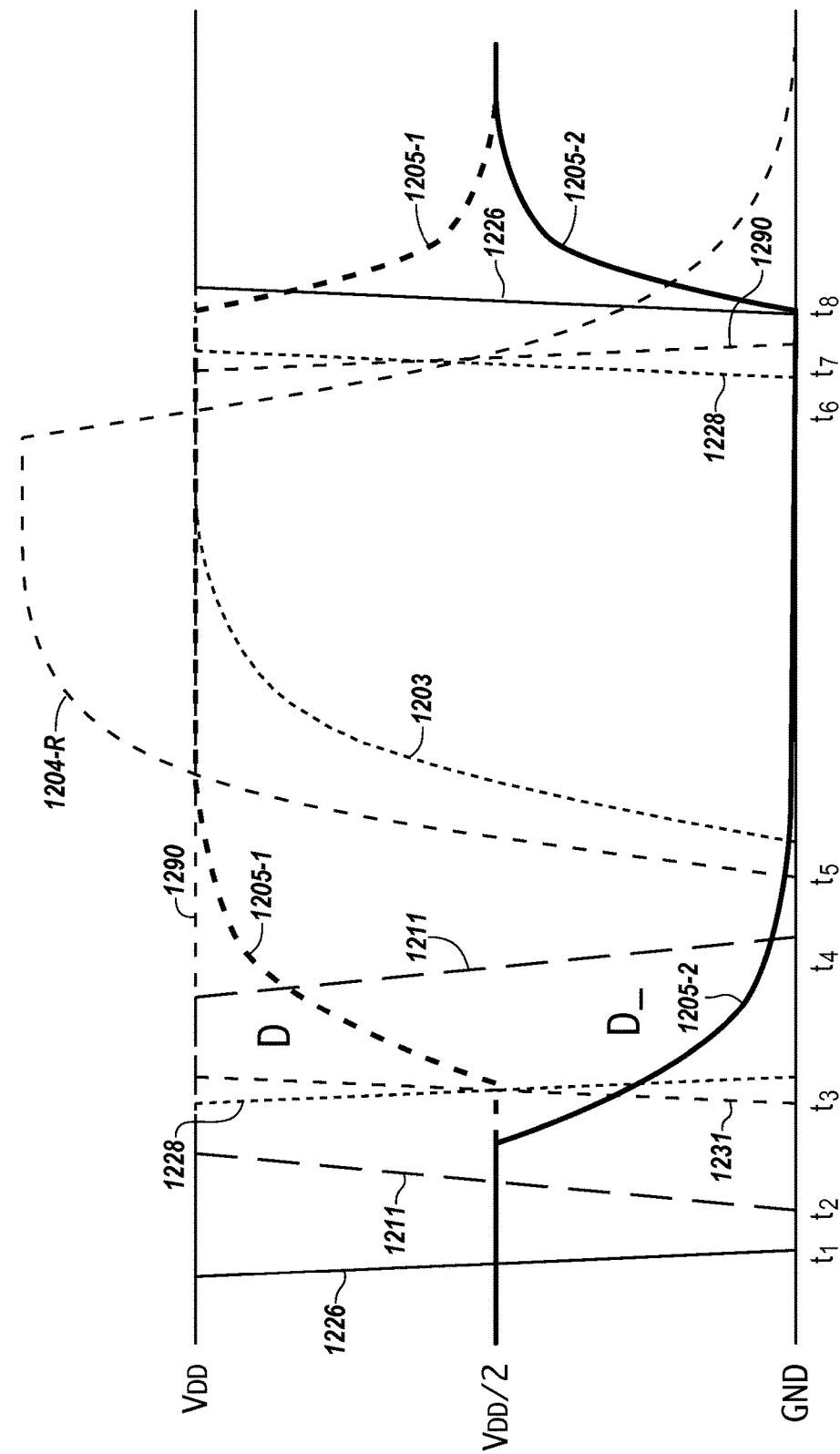
FIG. 12 illustrates a timing diagram associated with performing a number of logical operations using sensing circuitry in accordance with a number of embodiments of the present disclosure.

FIG. 12 illustrates a timing diagram associated with performing a number of logical operations using sensing circuitry in accordance with a number of embodiments of the present disclosure. The timing diagram illustrated in FIG. 12 shows signals (e.g., voltage signals) associated with performing a last operation phase of a logical operation (e.g., an R-input logical operation). For instance, the timing diagram illustrated in FIG. 12 corresponds to a last operation phase of an R-input AND operation or an R-input OR operation.

For example, performing a last operation phase of an R-input can include performing the operation phase shown in FIG. 12 subsequent to a number of iterations of the intermediate operation phase(s) described in association with FIGS. 10 and/or 11. Table 1 shown below indicates the Figures corresponding to the sequence of operation phases associated with performing a number of R-input logical operations in accordance with a number of embodiments described herein.

TABLE 1

| Operation | FIG. 9 | FIG. 10 | FIG. 11 | FIG. 12 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

The last operation phase illustrated in the timing diagram of FIG. 12 is described in association with storing a result of an R-input logical operation to a row of the array. However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 12, at time $t_1$, equilibration is disabled (e.g., the equilibration signal 1226 is deactivated) such that data lines D and D_ are floating. At time t2, the PASSD control signal 1211 (and PASSDB signal) is activated for an AND or OR operation.

Activating the PASSD control signal 1211 (and PASSDB signal) (e.g., in association with an AND or OR operation) transfers the accumulated output stored in the secondary latch 564 of compute component 531-1 shown in FIG. 5 to the primary latch of sense amplifier 506. For instance, for an AND operation, if any of the memory cells sensed in the prior operation phases (e.g., the first operation phase illustrated in FIG. 9 and one or more iterations of the intermediate operation phase illustrated in FIG. 10) stored a logic "0" (e.g., if any of the R-inputs of the AND operation were a logic "0"), then the data line D_ will carry a voltage corresponding to logic "1" (e.g., $V_{CC}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1".

At time t3, the primary latch of sense amplifier 506 is then enabled (e.g., a positive control signal 1290 (e.g., corresponding to ACT 690 shown in FIG. 6) goes low and the negative control signal 1228 (e.g., corresponding to RnIF 628 shown in FIG. 6) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{CC}$ if all of the input data values are a logic "1."

For an OR operation, if any of the memory cells sensed in the prior operation phases (e.g., the first operation phase of FIG. 9 and one or more iterations of the intermediate operation phase shown in FIG. 11) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{CC}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 506 is then enabled and the data line D now carries the ORed result of the respective input data values as determined from the memory cells sensed during the prior operation phases. As such, data line D will be at $V_{CC}$ if any of the input data values are a logic "1" and data line D will be at ground if all of the input data values are a logic "0."

The result of the R-input AND or OR logical operations can then be stored back to a memory cell of array 130 shown in FIG. 1. In the examples shown in FIG. 12, the result of the R-input logical operation is stored to a memory cell coupled to the last row opened (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 12 shows, at time t7, the positive control signal 1290 and the negative control signal 1228 being deactivated (e.g., signal 1290 goes low and signal 1228 goes high) to disable the sense amplifier 506 shown in FIG. 5. At time t4 the PASSD control signal 1211 (and PASSDB signal) that was activated at time t2 is deactivated. Embodiments are not limited to this example. For instance, in a number of embodiments, the sense amplifier 506 shown in FIG. 5 may be enabled subsequent to time t4 (e.g., after the PASSD control signal 1211 (and PASSDB signal) are deactivated).

As shown in FIG. 12, at time t5, a selected row is enabled (e.g., by row enabling signal 1204 going high, which drives the capacitor of the selected cell to the voltage corresponding to the logic value stored in the accumulator. At time t6 the selected row is disabled. At time t7 the sense amplifier 506 shown in FIG. 5 is disabled (e.g., positive control signal 1228 and negative control signal 1290 are deactivated), and at time t8 equilibration occurs (e.g., signal 1226 is activated and the voltages on the complementary data lines 1205-1 (D) and 1205-2 (D_) are brought to the equilibration voltage).

Although the example of performing a last operation phase of an R-input was discussed above with respect to FIG. 12 for performing AND and OR logical operations, embodiments are not limited to these logical operations. For example, the NAND and NOR operations can also involve a last operation phase of an R-input that is stored back to a memory cell of array 130 (shown in FIG. 1) using control signals to operate the sensing circuitry illustrated in FIG. 5.

Figure 13:
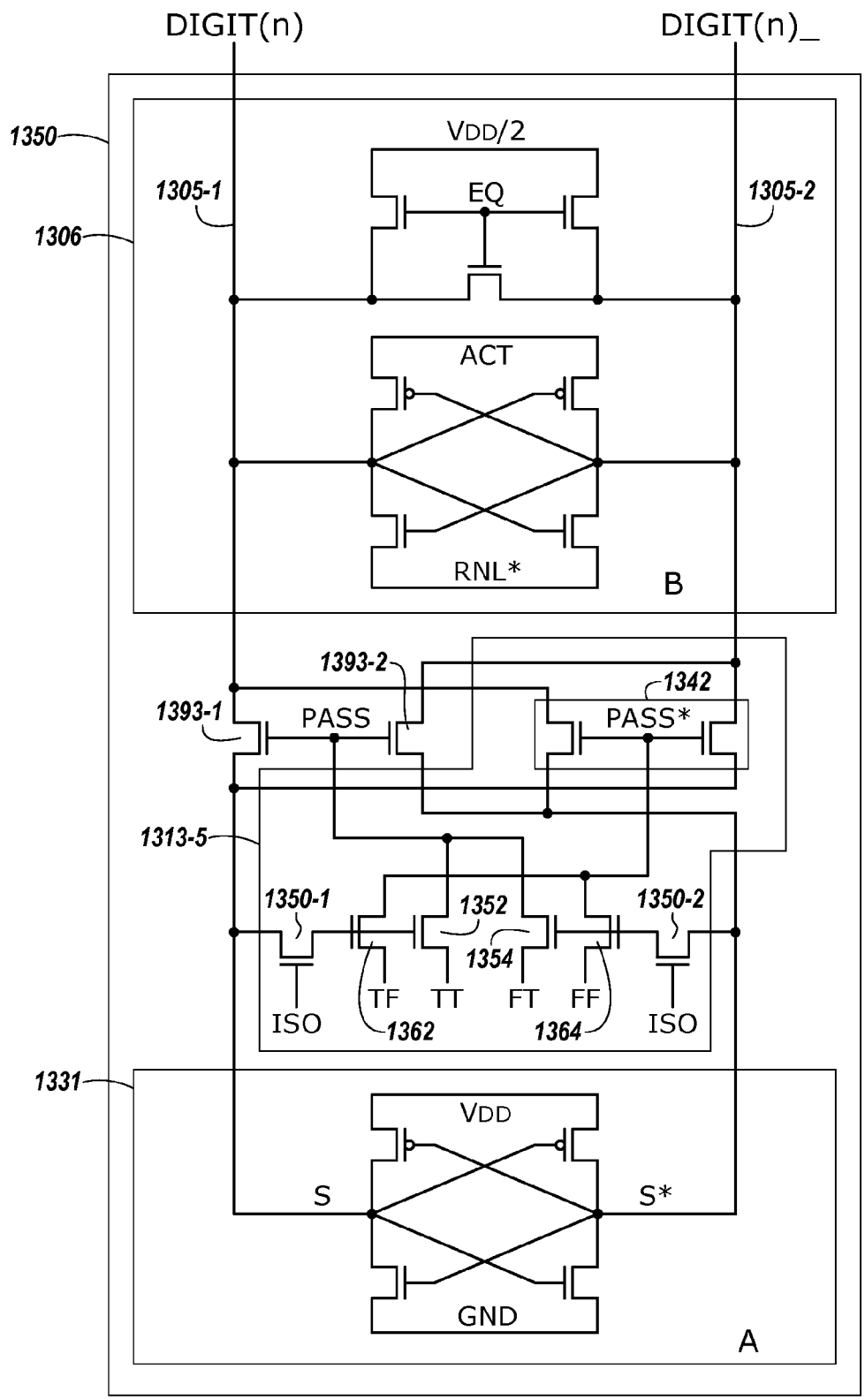
FIG. 13 is a schematic diagram illustrating sensing circuitry having selectable logical operation selection logic in accordance with a number of embodiments of the present disclosure.

FIG. 13 is a schematic diagram illustrating sensing circuitry having selectable logical operation selection logic in accordance with a number of embodiments of the present disclosure. FIG. 13 shows a sense amplifier 1306 coupled to a pair of complementary sense lines 1305-1 and 1305-2, and a compute component 1331 coupled to the sense amplifier 1306 via pass gates 1393-1 and 1393-2. The gates of the pass gates 1393-1 and 1393-2 can be controlled by a logical operation selection logic signal, PASS, which can be output from logical operation selection logic 1313-5. FIG. 13 shows the compute component 1331 labeled "A" and the sense amplifier 1306 labeled "B" to indicate that the data value stored in the compute component 1331 is the "A" data value and the data value stored in the sense amplifier 1306 is the "B" data value shown in the logic tables illustrated with respect to FIG. 14.

The sensing circuitry 1350 illustrated in FIG. 13 includes logical operation selection logic 1313-5. In this example, the logic 1313-5 comprises swap gates 1342 controlled by a logical operation selection logic signal PASS*. The logical operation selection logic 1313-5 also comprises four logic selection transistors: logic selection transistor 1362 coupled between the gates of the swap transistors 1342 and a TF signal control line, logic selection transistor 1352 coupled between the gates of the pass gates 1393-1 and 1393-2 and a TT signal control line, logic selection transistor 1354 coupled between the gates of the pass gates 1393-1 and 1393-2 and a FT signal control line, and logic selection transistor 1364 coupled between the gates of the swap transistors 1342 and a FF signal control line. Gates of logic selection transistors 1362 and 1352 are coupled to the true sense line (e.g., 1305-1) through isolation transistor 1350-1 (having a gate coupled to an ISO signal control line), and gates of logic selection transistors 1364 and 1354 are coupled to the complementary sense line (e.g., 1305-2) through isolation transistor 1350-2 (also having a gate coupled to an ISO signal control line).

Operation of logic selection transistors 1352 and 1354 are similar based on the state of the TT and FT selection signals and the data values on the respective complementary sense lines at the time the ISO signal is asserted. Logic selection transistors 1362 and 1364 also operate in a similar manner to control (e.g., enable by turning on or disable by turning off) the swap transistors 1342. That is, to enable (e.g., turn on) the swap transistors 1342, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1342 will not be enabled by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines DIGIT(n)/DIGIT(n)_ together, which may be a disruptive configuration to be avoided. Logical operations results for the sensing circuitry illustrated in FIG. 13 are summarized in the logic table illustrated in FIG. 14.

FIG. 14 is a logic table illustrating selectable logic operation results implementable by the sensing circuitry shown in FIG. 13 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1306 and compute component 1331. The four control signals (e.g., TF, TT, FT, and FF), in conjunction with a particular data value present on the complementary sense lines, controls the pass gates 1393-1 and 1393-2 and swap transistors 1342, which in turn affects the data value in the compute component 1331 and/or sense amplifier 1306 before/after firing. The capability to selectably control the swap transistors 1342 facilitates implementing logical operations involving inverse data values (e.g., inverse operands and/or inverse result), among others.

The logic table illustrated in FIG. 14 shows the starting data value stored in the compute component 1331 shown in column A at 1444, and the starting data value stored in the sense amplifier 1306 shown in column B at 1445. The other 3 top column headings (NOT OPEN, OPEN TRUE, and OPEN INVERT) in the logic table of FIG. 14 refer to the state of the pass gates 1393-1 and 1393-2, and the swap transistors 1342, which can respectively be controlled to be OPEN or CLOSED depending on the state of the four logic selection control signals (e.g., TF, TT, FT, and FF), in conjunction with a particular data value present on the pair of complementary sense lines 1305-1 and 1305-2 when the ISO control signal is asserted. The "Not Open" column corresponds to the pass gates 1393-1 and 1393-2 and the swap transistors 1342 both being in a non-conducting (e.g., off) condition, the "Open True" corresponds to the pass gates 1393-1 and 1393-2 being in a conducting (e.g., on) condition, and the "Open Invert" corresponds to the swap transistors 1342 being in a conducting condition. The configuration corresponding to the pass gates 1393-1 and 1393-2 and the swap transistors 1342 both being in a conducting condition is not reflected in the logic table of FIG. 14 since this results in the sense lines being shorted together.

Via selective control of the pass gates 1393-1 and 1393-2 and the swap transistors 1342, each of the three columns of the first set of two rows of the upper portion of the logic table of FIG. 14 can be combined with each of the three columns of the second set of two rows below the first set to provide 3×3=9 different result combinations, corresponding to nine different logical operations, as indicated by the various connecting paths shown at 1475. The nine different selectable logical operations that can be implemented by the sensing circuitry 1350 are summarized in the logic table illustrated in FIG. 14.

The columns of the lower portion of the logic table illustrated in FIG. 14 show a heading 1480 that includes the state of logic selection control signals. For example, the state of a first logic selection control signal (e.g., FF) is provided in row 1476, the state of a second logic selection control signal (e.g., FT) is provided in row 1477, the state of a third logic selection control signal (e.g., TF) is provided in row 1478, and the state of a fourth logic selection control signal (e.g., TT) is provided in row 1479. The particular logical operation corresponding to the results is summarized in row 1447.

As such, the sensing circuitry shown in FIG. 13 can be used to perform various logical operations as shown in FIG. 14. For example, the sensing circuitry 1350 can be operated to perform various logical operations (e.g., AND and OR logical operations) in association with determining population count in accordance with a number of embodiments of the present disclosure.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells coupled to sensing circuitry and to a plurality of sense lines;
the sensing circuitry comprising a sense amplifier and a compute component coupled to the plurality of sense lines, wherein the sense amplifier comprises a primary latch and the compute component comprises a secondary latch; and
a controller configured to use the sense amplifier and the compute component to cause:
summing, in parallel and using the primary latch and the secondary latch, of data values corresponding to respective ones of a plurality of first vectors stored in memory cells of the array as a data value sum representing a population count thereof, wherein a second vector is stored as the plurality of first vectors, and wherein each first vector of the plurality of first vectors is stored in respective memory cells of the array that are coupled to a respective sense line of the plurality of sense lines;
storing the data value sums in the array of memory cells; and
iteratively summing, in parallel and using the primary latch and the secondary latch, of the stored data value sums corresponding to the plurality of first vectors to provide a single data value sum corresponding to the second vector.

2. The apparatus of claim 1, wherein the apparatus is configured to sum data values corresponding to respective ones of the plurality of first vectors without transferring data values via an input/output (I/O) line outside the array of memory cells and sensing circuitry.

3. The apparatus of claim 1, wherein the apparatus is configured to iteratively sum the stored data value sums in parallel without transferring the stored data values via an input/output (I/O) line outside the array of memory cells and sensing circuitry.

4. The apparatus of claim 1, wherein the apparatus is configured to perform the summing acts without transferring data values to a control component external to the array and sensing circuitry.

5. The apparatus of claim 4, wherein the sensing circuitry comprises transistors formed on pitch with transistors of the array of memory cells.

6. An apparatus, comprising:
an array of memory cells coupled to sensing circuitry and to a number of sense lines;
the sensing circuitry comprising a sense amplifier and a compute component coupled to the number of sense lines, wherein the sense amplifier comprises a primary latch and the compute component comprises a secondary latch; and
a controller configured to use the sense amplifier and the compute component to cause:
summing, in parallel and using the primary latch and the secondary latch, of data values stored in memory cells coupled to the number of sense lines and a number of access lines of the array of memory cells to determine a data value sum corresponding to each respective one of the number of sense lines;
storing of a respective data value sum of the data value sums in memory cells coupled to the respective sense line to which the respective data value sum corresponds; and
summing, using the secondary latch, of the stored data value sums to determine a resultant sum representing a population count corresponding to the data values stored in the memory cells coupled to the number of the number of sense lines and to the number of access lines.

7. The apparatus of claim 6, wherein the controller is configured to cause storing of the data value sums in memory cells coupled to access lines other than the number of access lines to which memory cells storing the data values are coupled.

8. The apparatus of claim 6, wherein the controller is configured to cause storing of the data value sums as vertical bit vectors.

9. The apparatus of claim 6, wherein the controller being configured to cause summing of the data value sums to determine a resultant sum comprises the controller being configured to cause:
summing, in parallel, of a number of pairs of the stored data value sums to determine a number of updated data value sums; and
storing of the number of updated data value sums in memory cells coupled to respective ones of the number of sense lines to which the data value sums correspond; and
responsive to the number of updated data value sums being greater than one, subsequently summing, in parallel, of a number of pairs of the updated data value sums to determine a number of updated updated data value sums; and
storing of the number of updated updated data value sums in memory cells coupled to respective ones of the number of sense lines to which the updated data value sums correspond.

10. The apparatus of claim 6, wherein the controller being configured to cause the storing of the data value sums comprises the controller being configured to cause the data value sums to be stored as:
M-bit vertical bit vectors, and wherein the controller being configured to cause summing of the stored data value sums comprises the controller being configured to cause:
summing respective pairs of the M-bit vertical bit vectors; and
storing the sums of the respective pairs of the M-bit vertical bit vectors in $\log_2$ (M) memory cells of the array of memory cells.

11. The apparatus of claim 6, wherein the controller is configured to cause storing of the data values as a plurality of vertical bit vectors.

12. The apparatus of claim 6, wherein the controller is configured to cause storing of the data values in the array of memory cells using the memory cells coupled to the number of sense lines.

13. The apparatus of claim 6, wherein the controller is configured to cause storing the data values in the array as a plurality of vertical bit vectors, each of the plurality of vertical bit vectors being arranged such that elements of a respective one of the plurality of vertical bit vectors is stored in memory cells coupled to a respective one of the number of sense lines.

14. The apparatus of claim 6, wherein the apparatus is configured to perform logical operations without transferring data out of the array of memory cells and sensing circuitry.

15. The apparatus of claim 6, wherein each sense line of the number of sense lines corresponds to a different column of the array of memory cells.

16. A method for determining population count, comprising:
- storing a vector in memory cells coupled to a number (R) of access lines and a number (C) of sense lines of an array coupled to sensing circuitry comprising a sense amplifier and a compute component coupled to the C sense lines, wherein the sense amplifier comprises a primary latch and the compute component comprises a secondary latch;
- performing, in parallel and using the primary latch and the secondary latch, a first summation operation on data values stored in memory cells coupled to respective ones of the C sense lines to determine C sense line population count sums corresponding to the respective sense lines;
- storing each respective one of the C sense line population count sums in memory cells coupled to a corresponding one of the C sense lines;
- subsequently performing a second summation operation, comprising:
  - summing, in parallel and using the primarily latch and the secondary latch, at least two particular sense line population count sums of the stored C sense line population count sums to provide a first number of updated population count sums; and
  - storing each respective one of the first number of updated population count sums in memory cells coupled to a respective one of the C sense lines; and
- responsive to the first number of updated population count sums being greater than one, subsequently performing a number of summation operation iterations, wherein each one of the number of summation operation iterations comprises:
  - summing, in parallel and using the primary latch and the secondary latch, at least two particular population count sums of the first number of updated population count sums determined in an immediate prior summation operation iteration to provide an updated number of updated population count sums;
  - storing each respective one of the updated number of updated population count sums in memory cells coupled to a respective one of the C sense lines; and
  - wherein the number of summation operation iterations are performed until the first number of updated population count sums is equal to one.

17. The method of claim 16, wherein each of the C sense line population count sums corresponds to a respective population count of a particular data value stored in the memory cells coupled to a respective one of the C sense lines.

18. The method of claim 16, wherein storing each respective one of the C sense line population count sums in memory cells coupled to a corresponding one of the C sense lines includes storing the each respective one of the C sense line population count sums in memory cells coupled to access lines of the array other than the R access lines to which memory cells storing the vector are coupled.

19. The method of claim 16, wherein performing the number of summation operation iterations until the number of updated population count sums is equal to one includes performing $\log_2$ (C)−1 summation operations; and wherein the updated population count sum when the number of updated population counts sums is one indicates the population count for the vector.

20. The method of claim 16, wherein the vector comprises a number (M) of digits with M/R digits of the vector being stored in memory cells coupled to each of the R access lines and M/C of the digits of the vector being stored in memory cells coupled to each of the C sense lines.

21. The method of claim 16, wherein:
- performing the second summation operation includes summing, in parallel, a number of pairs of the stored C sense line population count sums such that the first number of updated population count sums is C/2 population count sums; and
- performing a first summation operation iteration of the number of summation operation iterations includes summing, in parallel, pairs of the C/2 updated population count sums such that the updated number of updated population count sums is C/4.

22. The method of claim 16, wherein performing the second summation operation and subsequently performing the number of summation operation iterations includes performing $\log_2$ (C) summation operations.

23. A method for determining population count, comprising:
- storing a vector as a plurality of bit vectors in a memory array coupled to a plurality of sense lines and coupled to a sensing circuitry comprising a sense amplifier and a compute component, wherein the sense amplifier comprises a primary latch and the compute component comprises a secondary latch and wherein the sense amplifier and the compute component are coupled to the plurality of sense lines;
- determining, in parallel and using the primary latch and the secondary latch, population counts of the plurality of bit vectors; and
- successively adding, using the secondary latch, the stored population counts of the plurality of bit vectors together to provide a population count for the vector.

24. The method of claim 23, wherein successively adding the population counts of the plurality of bit vectors together includes:
- adding a first pair of the population counts of the plurality of bit vectors together in parallel with adding a second pair of the population counts of the plurality of bit vectors together; and
- adding a sum of the first pair of the population counts to a sum of the second pair of the population counts.

25. The method of claim 23, wherein successively adding the population counts of the plurality of bit vectors together includes at most $\log_2$ (C) iterations of addition operations where C is a quantity of the bit vectors.

26. The method of claim 25, wherein determining population counts of the plurality of bit vectors includes at most R−1+$\log_2$ (C) addition operations where R is a quantity access lines coupled to cells in which the vector is stored.

* * * * *